(12) United States Patent
Ferrari et al.

(10) Patent No.: US 11,581,916 B2
(45) Date of Patent: Feb. 14, 2023

(54) WIDEBAND POSITIONING REFERENCE SIGNAL PROCESSING VIA SUB-NYQUIST SAMPLING

(71) Applicant: QUALCOMM Incorporated, San Diego, CA (US)

(72) Inventors: Lorenzo Ferrari, Oakland, CA (US); Alexandros Manolakos, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/349,220

(22) Filed: Jun. 16, 2021

(65) Prior Publication Data

US 2021/0399762 A1    Dec. 23, 2021

Related U.S. Application Data

(60) Provisional application No. 63/041,017, filed on Jun. 18, 2020.

(51) Int. Cl.
*H04B 1/7163* (2011.01)
*H03M 1/12* (2006.01)
(Continued)

(52) U.S. Cl.
CPC ....... *H04B 1/71637* (2013.01); *H03H 7/0161* (2013.01); *H03M 1/12* (2013.01); *H04B 1/0032* (2013.01)

(58) Field of Classification Search
CPC .... H03M 1/1245; H03M 1/12; H04B 1/0025; H04B 1/06; H04B 1/16; H04B 1/71637; H04B 1/0032; H03H 7/0161
See application file for complete search history.

(56) References Cited

U.S. PATENT DOCUMENTS

2011/0243087 A1*  10/2011  Ahn ............... H04W 52/146
                                                           370/328
2013/0315195 A1*  11/2013  Ko .................. H04J 11/0079
                                                           370/329
(Continued)

FOREIGN PATENT DOCUMENTS

EP         3091367 A1     11/2016

OTHER PUBLICATIONS

International Search Report and Written Opinion—PCT/US2021/037790—ISA/EPO—dated Oct. 12, 2021.

*Primary Examiner* — Sophia Vlahos
(74) *Attorney, Agent, or Firm* — MG-IP Law, P.C.

(57) ABSTRACT

Disclosed are techniques for wireless communication. In an aspect, a band-pass filter of a radio frequency front end (RFFE) of a user equipment (UE) receives an analog radio frequency (RF) signal having a first bandwidth associated with a first sampling rate, the analog RF signal comprising a positioning reference signal (PRS). An analog-to-digital converter (ADC) of the UE samples the analog RF signal at a second sampling rate to generate a digital RF signal representing the analog RF signal, wherein the ADC operates at a second bandwidth lower than the first bandwidth, and wherein the second sampling rate is lower than the first sampling rate by an inverse of a folding factor for the first bandwidth. The digital RF signal is then output to a baseband processor of the UE.

28 Claims, 13 Drawing Sheets

(51) Int. Cl.
  *H03H 7/01*  (2006.01)
  *H04B 1/00*  (2006.01)

(56) References Cited

U.S. PATENT DOCUMENTS

2016/0150415 A1    5/2016  Laneman et al.
2019/0043704 A1*   2/2019  Kozhinov ........... H01J 49/0036
2019/0363843 A1*  11/2019  Gordaychik ......... H04W 52/58
2020/0154449 A1    5/2020  Akkarakaran et al.

* cited by examiner

WIDEBAND POSITIONING REFERENCE SIGNAL PROCESSING VIA SUB-NYQUIST SAMPLING

CROSS-REFERENCE TO RELATED APPLICATIONS

The present Application for Patent claims the benefit of U.S. Provisional Application No. 63/041,017, entitled "WIDEBAND POSITIONING REFERENCE SIGNAL PROCESSING VIA SUB-NYQUIST SAMPLING," filed Jun. 18, 2020, assigned to the assignee hereof, and expressly incorporated herein by reference in its entirety.

BACKGROUND OF THE DISCLOSURE

1. Field of the Disclosure

Aspects of the disclosure relate generally to wireless communications.

2. Description of the Related Art

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., Long Term Evolution (LTE) or WiMax). There are presently many different types of wireless communication systems in use, including cellular and personal communications service (PCS) systems. Examples of known cellular systems include the cellular analog advanced mobile phone system (AMPS), and digital cellular systems based on code division multiple access (CDMA), frequency division multiple access (FDMA), time division multiple access (TDMA), the Global System for Mobile communications (GSM), etc.

A fifth generation (5G) wireless standard, referred to as New Radio (NR), calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, with 1 gigabit per second to tens of workers on an office floor. Several hundreds of thousands of simultaneous connections should be supported in order to support large sensor deployments. Consequently, the spectral efficiency of 5G mobile communications should be significantly enhanced compared to the current 4G standard. Furthermore, signaling efficiencies should be enhanced and latency should be substantially reduced compared to current standards.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a method of wireless communication performed by a user equipment (UE) includes receiving, at a band-pass filter of a radio frequency front end (RFFE) of the UE, an analog radio frequency (RF) signal having a first bandwidth associated with a first sampling rate, the analog RF signal comprising a positioning reference signal (PRS); sampling, by an analog-to-digital converter (ADC) of the UE, the analog RF signal at a second sampling rate to generate a digital RF signal representing the analog RF signal, wherein the ADC operates at a second bandwidth lower than the first bandwidth, and wherein the second sampling rate is lower than the first sampling rate by an inverse of a folding factor for the first bandwidth; and outputting the digital RF signal to a baseband processor of the UE.

In an aspect, a user equipment (UE) includes a memory; a band-pass filter of a radio frequency front end (RFFE) configured to receive an analog radio frequency (RF) signal having a first bandwidth associated with a first sampling rate, the analog RF signal comprising a positioning reference signal (PRS); an analog-to-digital converter (ADC); and a baseband processor communicatively coupled to the ADC, wherein the ADC is configured to: sample the analog RF signal at a second sampling rate to generate a digital RF signal representing the analog RF signal, wherein the ADC operates at a second bandwidth lower than the first bandwidth, and wherein the second sampling rate is lower than the first sampling rate by an inverse of a folding factor for the first bandwidth; and output the digital RF signal to the baseband processor.

In an aspect, a user equipment (UE) includes means for receiving, at a band-pass filter of a radio frequency front end (RFFE) of the UE, an analog radio frequency (RF) signal having a first bandwidth associated with a first sampling rate, the analog RF signal comprising a positioning reference signal (PRS); means for sampling the analog RF signal at a second sampling rate to generate a digital RF signal representing the analog RF signal, wherein the means for sampling operates at a second bandwidth lower than the first bandwidth, and wherein the second sampling rate is lower than the first sampling rate by an inverse of a folding factor for the first bandwidth; and means for outputting the digital RF signal to a baseband processor of the UE.

In an aspect, a non-transitory computer-readable medium stores computer-executable instructions that, when executed by a user equipment (UE), cause the UE to: receive, at a band-pass filter of a radio frequency front end (RFFE) of the UE, an analog radio frequency (RF) signal having a first bandwidth associated with a first sampling rate, the analog RF signal comprising a positioning reference signal (PRS); sample, by an analog-to-digital converter (ADC), the analog RF signal at a second sampling rate to generate a digital RF signal representing the analog RF signal, wherein the ADC operates at a second bandwidth lower than the first bandwidth, and wherein the second sampling rate is lower than the first sampling rate by an inverse of a folding factor for the first bandwidth; and output the digital RF signal to a baseband processor of the UE.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Figure 1:
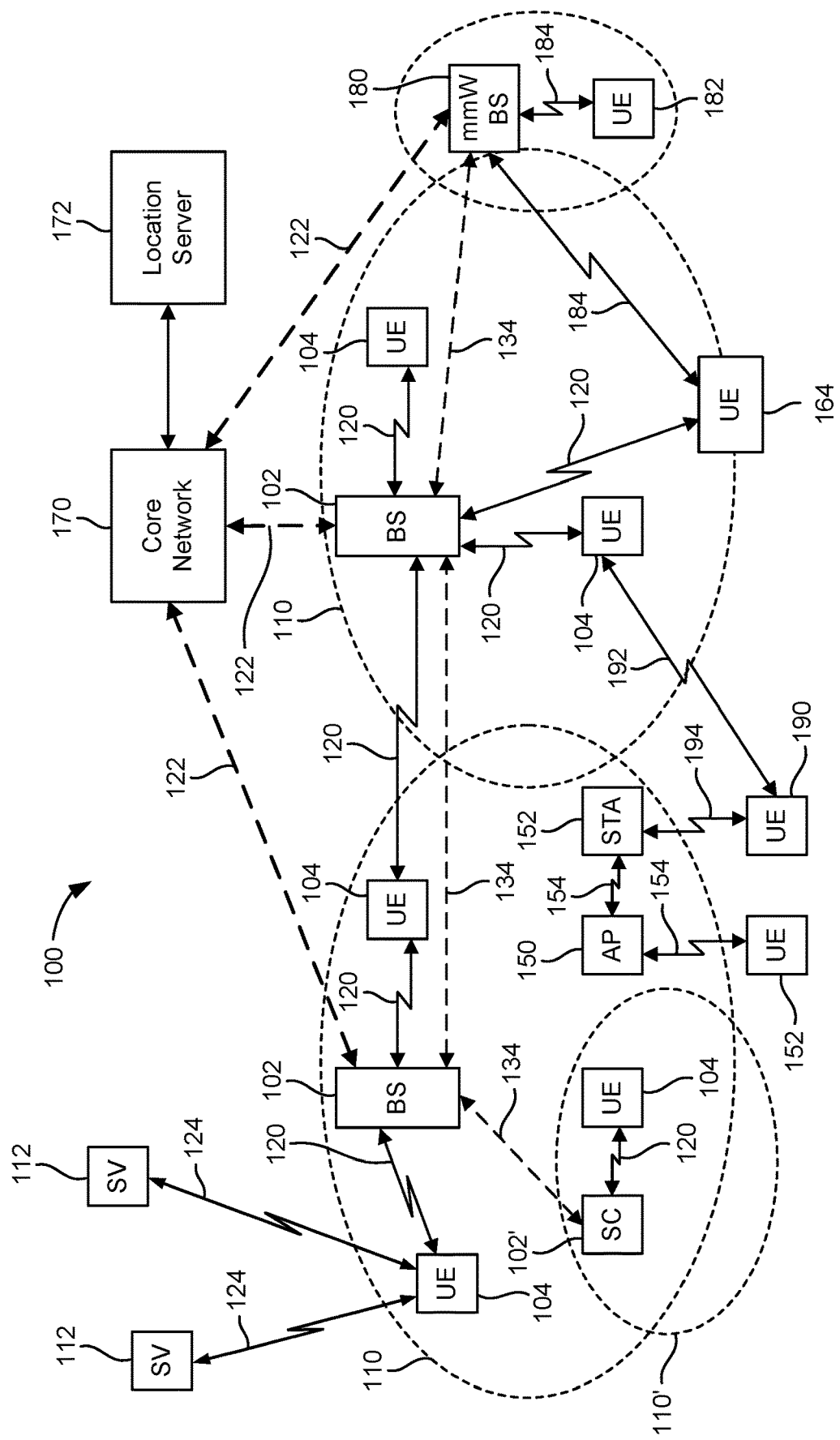
FIG. 1 illustrates an example wireless communications system, according to aspects of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

As used herein, the terms "user equipment" (UE) and "base station" are not intended to be specific or otherwise limited to any particular radio access technology (RAT), unless otherwise noted. In general, a UE may be any wireless communication device (e.g., a mobile phone, router, tablet computer, laptop computer, consumer asset locating device, wearable (e.g., smartwatch, glasses, augmented reality (AR)/virtual reality (VR) headset, etc.), vehicle (e.g., automobile, motorcycle, bicycle, etc.), Internet of Things (IoT) device, etc.) used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or "UT," a "mobile device," a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on the Institute of Electrical and Electronics Engineers (IEEE) 802.11 specification, etc.) and so on.

A base station may operate according to one of several RATs in communication with UEs depending on the network in which it is deployed, and may be alternatively referred to as an access point (AP), a network node, a NodeB, an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems a base station may provide purely edge node signaling functions while in other systems it may provide additional control and/or network management functions. A communication link through which UEs can send signals to a base station is called an uplink (UL) channel (e.g., a reverse traffic channel, a reverse control channel, an access channel, etc.). A communication link through which the base station can send signals to UEs is called a downlink (DL) or forward link channel (e.g., a paging channel, a control channel, a broadcast channel, a forward traffic channel, etc.). As used herein the term traffic channel (TCH) can refer to either an uplink/reverse or downlink/forward traffic channel.

The term "base station" may refer to a single physical transmission-reception point (TRP) or to multiple physical TRPs that may or may not be co-located. For example, where the term "base station" refers to a single physical TRP, the physical TRP may be an antenna of the base station corresponding to a cell (or several cell sectors) of the base station. Where the term "base station" refers to multiple co-located physical TRPs, the physical TRPs may be an array of antennas (e.g., as in a multiple-input multiple-output (MIMO) system or where the base station employs beamforming) of the base station. Where the term "base station" refers to multiple non-co-located physical TRPs, the physical TRPs may be a distributed antenna system (DAS) (a network of spatially separated antennas connected to a common source via a transport medium) or a remote radio head (RRH) (a remote base station connected to a serving base station). Alternatively, the non-co-located physical TRPs may be the serving base station receiving the measurement report from the UE and a neighbor base station whose reference radio frequency (RF) signals the UE is measuring. Because a TRP is the point from which a base station transmits and receives wireless signals, as used herein, references to transmission from or reception at a base station are to be understood as referring to a particular TRP of the base station.

In some implementations that support positioning of UEs, a base station may not support wireless access by UEs (e.g., may not support data, voice, and/or signaling connections for UEs), but may instead transmit reference signals to UEs to be measured by the UEs, and/or may receive and measure signals transmitted by the UEs. Such a base station may be referred to as a positioning beacon (e.g., when transmitting signals to UEs) and/or as a location measurement unit (e.g., when receiving and measuring signals from UEs).

An "RF signal" comprises an electromagnetic wave of a given frequency that transports information through the space between a transmitter and a receiver. As used herein, a transmitter may transmit a single "RF signal" or multiple "RF signals" to a receiver. However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal" or simply a "signal" where it is clear from the context that the term "signal" refers to a wireless signal or an RF signal.

FIG. 1 illustrates an example wireless communications system 100, according to aspects of the disclosure. The wireless communications system 100 (which may also be referred to as a wireless wide area network (WWAN)) may include various base stations 102 (labeled "BS") and various UEs 104. The base stations 102 may include macro cell base stations (high power cellular base stations) and/or small cell base stations (low power cellular base stations). In an aspect, the macro cell base stations may include eNBs and/or ng-eNBs where the wireless communications system 100 corresponds to an LTE network, or gNBs where the wireless communications system 100 corresponds to a NR network, or a combination of both, and the small cell base stations may include femtocells, picocells, microcells, etc.

The base stations 102 may collectively form a RAN and interface with a core network 170 (e.g., an evolved packet core (EPC) or a 5G core (5GC)) through backhaul links 122, and through the core network 170 to one or more location servers 172 (e.g., a location management function (LMF) or a secure user plane location (SUPL) location platform (SLP)). The location server(s) 172 may be part of core network 170 or may be external to core network 170. In addition to other functions, the base stations 102 may perform functions that relate to one or more of transferring user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, RAN sharing, multimedia broadcast multicast service (MBMS), subscriber and equipment trace, RAN information management (RIM), paging, positioning, and delivery of warning messages. The base stations 102 may communicate with each other directly or indirectly (e.g., through the EPC/5GC) over backhaul links 134, which may be wired or wireless.

The base stations 102 may wirelessly communicate with the UEs 104. Each of the base stations 102 may provide communication coverage for a respective geographic coverage area 110. In an aspect, one or more cells may be supported by a base station 102 in each geographic coverage area 110. A "cell" is a logical communication entity used for communication with a base station (e.g., over some frequency resource, referred to as a carrier frequency, component carrier, carrier, band, or the like), and may be associated with an identifier (e.g., a physical cell identifier (PCI), an enhanced cell identifier (ECI), a virtual cell identifier (VCI), a cell global identifier (CGI), etc.) for distinguishing cells operating via the same or a different carrier frequency. In some cases, different cells may be configured according to different protocol types (e.g., machine-type communication (MTC), narrowband IoT (NB-IoT), enhanced mobile broadband (eMBB), or others) that may provide access for different types of UEs. Because a cell is supported by a specific base station, the term "cell" may refer to either or both of the logical communication entity and the base station that supports it, depending on the context. In addition, because a TRP is typically the physical transmission point of a cell, the terms "cell" and "TRP" may be used interchangeably. In some cases, the term "cell" may also refer to a geographic coverage area of a base station (e.g., a sector), insofar as a carrier frequency can be detected and used for communication within some portion of geographic coverage areas 110.

While neighboring macro cell base station 102 geographic coverage areas 110 may partially overlap (e.g., in a handover region), some of the geographic coverage areas 110 may be substantially overlapped by a larger geographic coverage area 110. For example, a small cell base station 102' (labeled "SC" for "small cell") may have a geographic coverage area 110' that substantially overlaps with the geographic coverage area 110 of one or more macro cell base stations 102. A network that includes both small cell and macro cell base stations may be known as a heterogeneous network. A heterogeneous network may also include home eNBs (HeNBs), which may provide service to a restricted group known as a closed subscriber group (CSG).

The communication links 120 between the base stations 102 and the UEs 104 may include uplink (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links 120 may be through one or more carrier frequencies. Allocation of carriers may be asymmetric with respect to downlink and uplink (e.g., more or less carriers may be allocated for downlink than for uplink).

The wireless communications system 100 may further include a wireless local area network (WLAN) access point (AP) 150 in communication with WLAN stations (STAs) 152 via communication links 154 in an unlicensed frequency spectrum (e.g., 5 GHz). When communicating in an unlicensed frequency spectrum, the WLAN STAs 152 and/or the WLAN AP 150 may perform a clear channel assessment (CCA) or listen before talk (LBT) procedure prior to communicating in order to determine whether the channel is available.

The small cell base station 102' may operate in a licensed and/or an unlicensed frequency spectrum. When operating in an unlicensed frequency spectrum, the small cell base station 102' may employ LTE or NR technology and use the same 5 GHz unlicensed frequency spectrum as used by the WLAN AP 150. The small cell base station 102', employing LTE/5G in an unlicensed frequency spectrum, may boost coverage to and/or increase capacity of the access network. NR in unlicensed spectrum may be referred to as NR-U. LTE in an unlicensed spectrum may be referred to as LTE-U, licensed assisted access (LAA), or MulteFire.

The wireless communications system 100 may further include a millimeter wave (mmW) base station 180 that may operate in mmW frequencies and/or near mmW frequencies in communication with a UE 182. Extremely high frequency (EHF) is part of the RF in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band have high path loss and a relatively short range. The mmW base station 180 and the UE 182 may utilize beamforming (transmit and/or receive) over a mmW communication link 184 to compensate for the extremely high path loss and short range. Further, it will be appreciated that in alternative configurations, one or more base stations 102 may also transmit using mmW or near mmW and beamforming. Accordingly, it will be appreciated that the foregoing illustrations are merely examples and should not be construed to limit the various aspects disclosed herein.

Transmit beamforming is a technique for focusing an RF signal in a specific direction. Traditionally, when a network node (e.g., a base station) broadcasts an RF signal, it broadcasts the signal in all directions (omni-directionally). With transmit beamforming, the network node determines where a given target device (e.g., a UE) is located (relative to the transmitting network node) and projects a stronger downlink RF signal in that specific direction, thereby providing a faster (in terms of data rate) and stronger RF signal for the receiving device(s). To change the directionality of the RF signal when transmitting, a network node can control the phase and relative amplitude of the RF signal at each of the one or more transmitters that are broadcasting the RF signal. For example, a network node may use an array of antennas (referred to as a "phased array" or an "antenna array") that creates a beam of RF waves that can be "steered" to point in different directions, without actually moving the antennas. Specifically, the RF current from the transmitter is fed to the individual antennas with the correct phase relationship so that the radio waves from the separate antennas add together to increase the radiation in a desired direction, while cancelling to suppress radiation in undesired directions.

Transmit beams may be quasi-co-located, meaning that they appear to the receiver (e.g., a UE) as having the same parameters, regardless of whether or not the transmitting antennas of the network node themselves are physically co-located. In NR, there are four types of quasi-co-location (QCL) relations. Specifically, a QCL relation of a given type means that certain parameters about a second reference RF signal on a second beam can be derived from information about a source reference RF signal on a source beam. Thus, if the source reference RF signal is QCL Type A, the receiver can use the source reference RF signal to estimate the Doppler shift, Doppler spread, average delay, and delay spread of a second reference RF signal transmitted on the same channel. If the source reference RF signal is QCL Type B, the receiver can use the source reference RF signal to estimate the Doppler shift and Doppler spread of a second reference RF signal transmitted on the same channel. If the source reference RF signal is QCL Type C, the receiver can use the source reference RF signal to estimate the Doppler shift and average delay of a second reference RF signal transmitted on the same channel. If the source reference RF signal is QCL Type D, the receiver can use the source reference RF signal to estimate the spatial receive parameter of a second reference RF signal transmitted on the same channel.

In receive beamforming, the receiver uses a receive beam to amplify RF signals detected on a given channel. For example, the receiver can increase the gain setting and/or adjust the phase setting of an array of antennas in a particular direction to amplify (e.g., to increase the gain level of) the RF signals received from that direction. Thus, when a receiver is said to beamform in a certain direction, it means the beam gain in that direction is high relative to the beam gain along other directions, or the beam gain in that direction is the highest compared to the beam gain in that direction of all other receive beams available to the receiver. This results in a stronger received signal strength (e.g., reference signal received power (RSRP), reference signal received quality (RSRQ), signal-to-interference-plus-noise ratio (SINR), etc.) of the RF signals received from that direction.

Transmit and receive beams may be spatially related. A spatial relation means that parameters for a second beam (e.g., a transmit or receive beam) for a second reference signal can be derived from information about a first beam (e.g., a receive beam or a transmit beam) for a first reference signal. For example, a UE may use a particular receive beam to receive a reference downlink reference signal (e.g., synchronization signal block (SSB)) from a base station. The UE can then form a transmit beam for sending an uplink reference signal (e.g., sounding reference signal (SRS)) to that base station based on the parameters of the receive beam.

Note that a "downlink" beam may be either a transmit beam or a receive beam, depending on the entity forming it. For example, if a base station is forming the downlink beam to transmit a reference signal to a UE, the downlink beam is a transmit beam. If the UE is forming the downlink beam, however, it is a receive beam to receive the downlink reference signal. Similarly, an "uplink" beam may be either a transmit beam or a receive beam, depending on the entity forming it. For example, if a base station is forming the uplink beam, it is an uplink receive beam, and if a UE is forming the uplink beam, it is an uplink transmit beam.

In 5G, the frequency spectrum in which wireless nodes (e.g., base stations 102/180, UEs 104/182) operate is divided into multiple frequency ranges, FR1 (from 450 to 6000 MHz), FR2 (from 24250 to 52600 MHz), FR3 (above 52600

MHz), and FR4 (between FR1 and FR2). mmW frequency bands generally include the FR2, FR3, and FR4 frequency ranges. As such, the terms "mmW" and "FR2" or "FR3" or "FR4" may generally be used interchangeably.

In a multi-carrier system, such as 5G, one of the carrier frequencies is referred to as the "primary carrier" or "anchor carrier" or "primary serving cell" or "PCell," and the remaining carrier frequencies are referred to as "secondary carriers" or "secondary serving cells" or "SCells." In carrier aggregation, the anchor carrier is the carrier operating on the primary frequency (e.g., FR1) utilized by a UE 104/182 and the cell in which the UE 104/182 either performs the initial radio resource control (RRC) connection establishment procedure or initiates the RRC connection re-establishment procedure. The primary carrier carries all common and UE-specific control channels, and may be a carrier in a licensed frequency (however, this is not always the case). A secondary carrier is a carrier operating on a second frequency (e.g., FR2) that may be configured once the RRC connection is established between the UE 104 and the anchor carrier and that may be used to provide additional radio resources. In some cases, the secondary carrier may be a carrier in an unlicensed frequency. The secondary carrier may contain only necessary signaling information and signals, for example, those that are UE-specific may not be present in the secondary carrier, since both primary uplink and downlink carriers are typically UE-specific. This means that different UEs 104/182 in a cell may have different downlink primary carriers. The same is true for the uplink primary carriers. The network is able to change the primary carrier of any UE 104/182 at any time. This is done, for example, to balance the load on different carriers. Because a "serving cell" (whether a PCell or an SCell) corresponds to a carrier frequency/component carrier over which some base station is communicating, the term "cell," "serving cell," "component carrier," "carrier frequency," and the like can be used interchangeably.

For example, still referring to FIG. 1, one of the frequencies utilized by the macro cell base stations 102 may be an anchor carrier (or "PCell") and other frequencies utilized by the macro cell base stations 102 and/or the mmW base station 180 may be secondary carriers ("SCells"). The simultaneous transmission and/or reception of multiple carriers enables the UE 104/182 to significantly increase its data transmission and/or reception rates. For example, two 20 MHz aggregated carriers in a multi-carrier system would theoretically lead to a two-fold increase in data rate (i.e., 40 MHz), compared to that attained by a single 20 MHz carrier.

The wireless communications system 100 may further include a UE 164 that may communicate with a macro cell base station 102 over a communication link 120 and/or the mmW base station 180 over a mmW communication link 184. For example, the macro cell base station 102 may support a PCell and one or more SCells for the UE 164 and the mmW base station 180 may support one or more SCells for the UE 164.

In the example of FIG. 1, any of the illustrated UEs (shown in FIG. 1 as a single UE 104 for simplicity) may receive signals 124 from one or more Earth orbiting space vehicles (SVs) 112 (e.g., satellites). In an aspect, the SVs 112 may be part of a satellite positioning system that a UE 104 can use as an independent source of location information. A satellite positioning system typically includes a system of transmitters (e.g., SVs 112) positioned to enable receivers (e.g., UEs 104) to determine their location on or above the Earth based, at least in part, on positioning signals (e.g., signals 124) received from the transmitters. Such a transmitter typically transmits a signal marked with a repeating pseudo-random noise (PN) code of a set number of chips. While typically located in SVs 112, transmitters may sometimes be located on ground-based control stations, base stations 102, and/or other UEs 104. A UE 104 may include one or more dedicated receivers specifically designed to receive signals 124 for deriving geo location information from the SVs 112.

In a satellite positioning system, the use of signals 124 can be augmented by various satellite-based augmentation systems (SBAS) that may be associated with or otherwise enabled for use with one or more global and/or regional navigation satellite systems. For example an SBAS may include an augmentation system(s) that provides integrity information, differential corrections, etc., such as the Wide Area Augmentation System (WAAS), the European Geostationary Navigation Overlay Service (EGNOS), the Multi-functional Satellite Augmentation System (MSAS), the Global Positioning System (GPS) Aided Geo Augmented Navigation or GPS and Geo Augmented Navigation system (GAGAN), and/or the like. Thus, as used herein, a satellite positioning system may include any combination of one or more global and/or regional navigation satellites associated with such one or more satellite positioning systems.

In an aspect, SVs 112 may additionally or alternatively be part of one or more non-terrestrial networks (NTNs). In an NTN, an SV 112 is connected to an earth station (also referred to as a ground station, NTN gateway, or gateway), which in turn is connected to an element in a 5G network, such as a modified base station 102 (without a terrestrial antenna) or a network node in a 5GC. This element would in turn provide access to other elements in the 5G network and ultimately to entities external to the 5G network, such as Internet web servers and other user devices. In that way, a UE 104 may receive communication signals (e.g., signals 124) from an SV 112 instead of, or in addition to, communication signals from a terrestrial base station 102.

The wireless communications system 100 may further include one or more UEs, such as UE 190, that connects indirectly to one or more communication networks via one or more device-to-device (D2D) peer-to-peer (P2P) links (referred to as "sidelinks"). In the example of FIG. 1, UE 190 has a D2D P2P link 192 with one of the UEs 104 connected to one of the base stations 102 (e.g., through which UE 190 may indirectly obtain cellular connectivity) and a D2D P2P link 194 with WLAN STA 152 connected to the WLAN AP 150 (through which UE 190 may indirectly obtain WLAN-based Internet connectivity). In an example, the D2D P2P links 192 and 194 may be supported with any well-known D2D RAT, such as LTE Direct (LTE-D), WiFi Direct (WiFi-D), Bluetooth®, and so on.

Figure 2A:
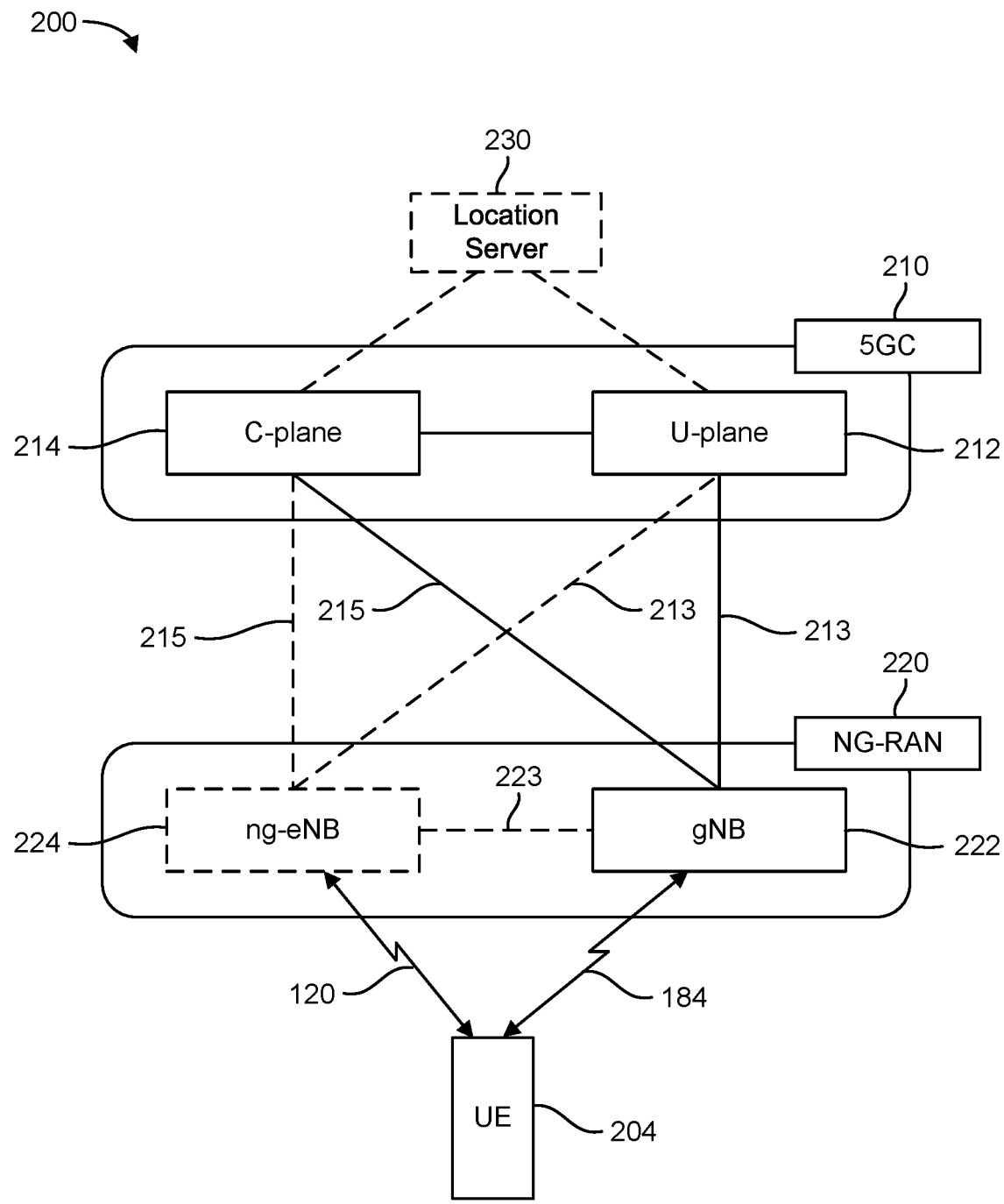
FIGS. 2A and 2B illustrate example wireless network structures, according to aspects of the disclosure.

FIG. 2A illustrates an example wireless network structure 200. For example, a 5GC 210 (also referred to as a Next Generation Core (NGC)) can be viewed functionally as control plane (C-plane) functions 214 (e.g., UE registration, authentication, network access, gateway selection, etc.) and user plane (U-plane) functions 212, (e.g., UE gateway function, access to data networks, IP routing, etc.) which operate cooperatively to form the core network. User plane interface (NG-U) 213 and control plane interface (NG-C) 215 connect the gNB 222 to the 5GC 210 and specifically to the user plane functions 212 and control plane functions 214, respectively. In an additional configuration, an ng-eNB 224 may also be connected to the 5GC 210 via NG-C 215 to the control plane functions 214 and NG-U 213 to user plane functions 212. Further, ng-eNB 224 may directly communicate with gNB 222 via a backhaul connection 223. In some configurations, a Next Generation RAN (NG-RAN) 220 may have one or more gNBs 222, while other configurations include one or more of both ng-eNBs 224 and gNBs 222. Either (or both) gNB 222 or ng-eNB 224 may communicate with one or more UEs 204 (e.g., any of the UEs described herein).

Another optional aspect may include a location server 230, which may be in communication with the 5GC 210 to provide location assistance for UE(s) 204. The location server 230 can be implemented as a plurality of separate servers (e.g., physically separate servers, different software modules on a single server, different software modules spread across multiple physical servers, etc.), or alternately may each correspond to a single server. The location server 230 can be configured to support one or more location services for UEs 204 that can connect to the location server 230 via the core network, 5GC 210, and/or via the Internet (not illustrated). Further, the location server 230 may be integrated into a component of the core network, or alternatively may be external to the core network (e.g., a third party server, such as an original equipment manufacturer (OEM) server or service server).

Figure 2B:
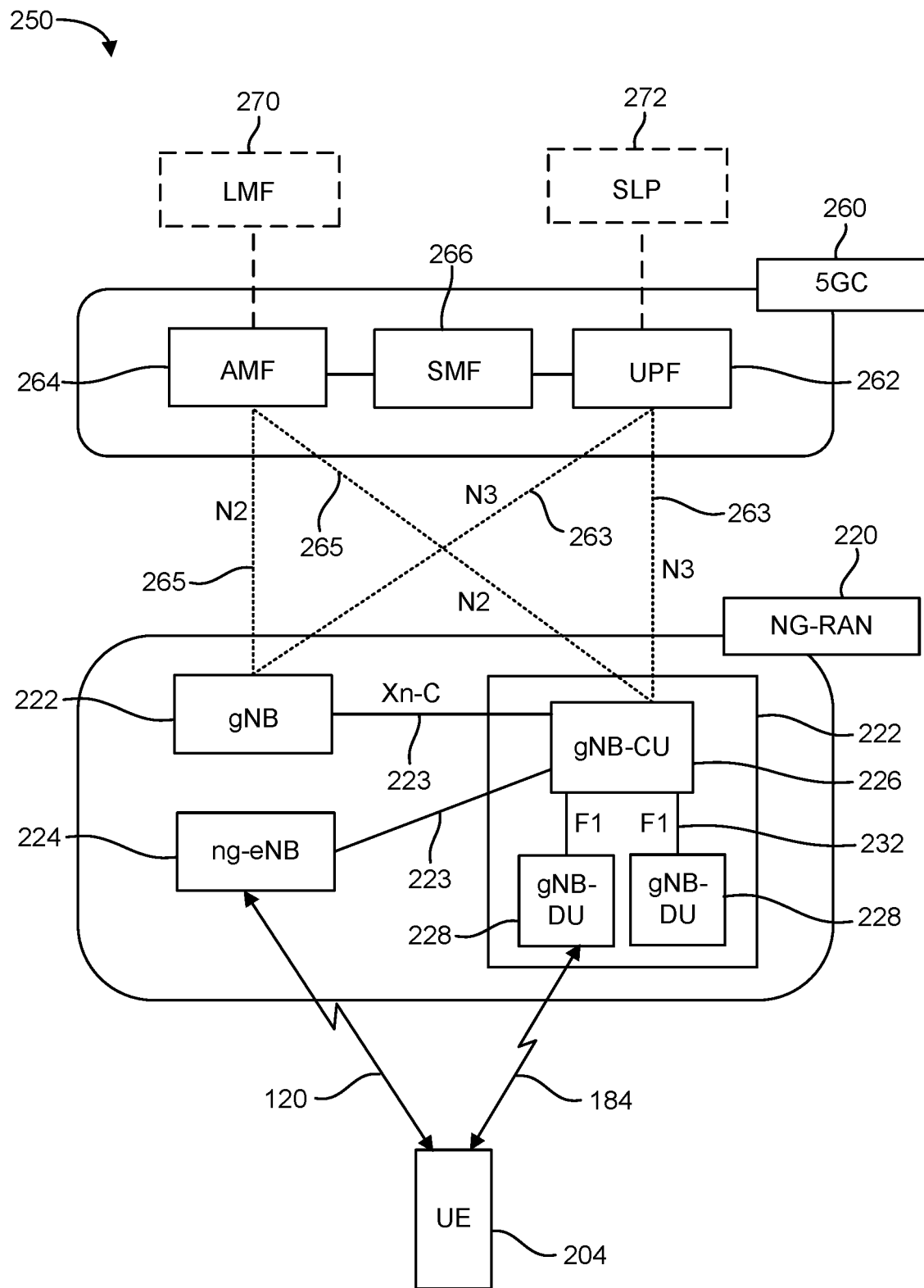

FIG. 2B illustrates another example wireless network structure 250. A 5GC 260 (which may correspond to 5GC 210 in FIG. 2A) can be viewed functionally as control plane functions, provided by an access and mobility management function (AMF) 264, and user plane functions, provided by a user plane function (UPF) 262, which operate cooperatively to form the core network (i.e., 5GC 260). The functions of the AMF 264 include registration management, connection management, reachability management, mobility management, lawful interception, transport for session management (SM) messages between one or more UEs 204 (e.g., any of the UEs described herein) and a session management function (SMF) 266, transparent proxy services for routing SM messages, access authentication and access authorization, transport for short message service (SMS) messages between the UE 204 and the short message service function (SMSF) (not shown), and security anchor functionality (SEAF). The AMF 264 also interacts with an authentication server function (AUSF) (not shown) and the UE 204, and receives the intermediate key that was established as a result of the UE 204 authentication process. In the case of authentication based on a UMTS (universal mobile telecommunications system) subscriber identity module (USIM), the AMF 264 retrieves the security material from the AUSF. The functions of the AMF 264 also include security context management (SCM). The SCM receives a key from the SEAF that it uses to derive access-network specific keys. The functionality of the AMF 264 also includes location services management for regulatory services, transport for location services messages between the UE 204 and a location management function (LMF) 270 (which acts as a location server 230), transport for location services messages between the NG-RAN 220 and the LMF 270, evolved packet system (EPS) bearer identifier allocation for interworking with the EPS, and UE 204 mobility event notification. In addition, the AMF 264 also supports functionalities for non-3GPP (Third Generation Partnership Project) access networks.

Functions of the UPF 262 include acting as an anchor point for intra-/inter-RAT mobility (when applicable), acting as an external protocol data unit (PDU) session point of interconnect to a data network (not shown), providing packet routing and forwarding, packet inspection, user plane policy rule enforcement (e.g., gating, redirection, traffic steering), lawful interception (user plane collection), traffic usage reporting, quality of service (QoS) handling for the user plane (e.g., uplink/downlink rate enforcement, reflective QoS marking in the downlink), uplink traffic verification (service data flow (SDF) to QoS flow mapping), transport level packet marking in the uplink and downlink, downlink packet buffering and downlink data notification triggering, and sending and forwarding of one or more "end markers" to the source RAN node. The UPF 262 may also support transfer of location services messages over a user plane between the UE 204 and a location server, such as an SLP 272.

The functions of the SMF 266 include session management, UE Internet protocol (IP) address allocation and management, selection and control of user plane functions, configuration of traffic steering at the UPF 262 to route traffic to the proper destination, control of part of policy enforcement and QoS, and downlink data notification. The interface over which the SMF 266 communicates with the AMF 264 is referred to as the N11 interface.

Another optional aspect may include an LMF 270, which may be in communication with the 5GC 260 to provide location assistance for UEs 204. The LMF 270 can be implemented as a plurality of separate servers (e.g., physically separate servers, different software modules on a single server, different software modules spread across multiple physical servers, etc.), or alternately may each correspond to a single server. The LMF 270 can be configured to support one or more location services for UEs 204 that can connect to the LMF 270 via the core network, 5GC 260, and/or via the Internet (not illustrated). The SLP 272 may support similar functions to the LMF 270, but whereas the LMF 270 may communicate with the AMF 264, NG-RAN 220, and UEs 204 over a control plane (e.g., using interfaces and protocols intended to convey signaling messages and not voice or data), the SLP 272 may communicate with UEs 204 and external clients (not shown in FIG. 2B) over a user plane (e.g., using protocols intended to carry voice and/or data like the transmission control protocol (TCP) and/or IP).

User plane interface 263 and control plane interface 265 connect the 5GC 260, and specifically the UPF 262 and AMF 264, respectively, to one or more gNBs 222 and/or ng-eNBs 224 in the NG-RAN 220. The interface between gNB(s) 222 and/or ng-eNB(s) 224 and the AMF 264 is referred to as the "N2" interface, and the interface between gNB(s) 222 and/or ng-eNB(s) 224 and the UPF 262 is referred to as the "N3" interface. The gNB(s) 222 and/or ng-eNB(s) 224 of the NG-RAN 220 may communicate directly with each other via backhaul connections 223, referred to as the "Xn-C" interface. One or more of gNBs 222 and/or ng-eNBs 224 may communicate with one or more UEs 204 over a wireless interface, referred to as the "Uu" interface.

The functionality of a gNB 222 is divided between a gNB central unit (gNB-CU) 226 and one or more gNB distributed units (gNB-DUs) 228. The interface 232 between the gNB-CU 226 and the one or more gNB-DUs 228 is referred to as the "F1" interface. A gNB-CU 226 is a logical node that includes the base station functions of transferring user data, mobility control, radio access network sharing, positioning, session management, and the like, except for those functions allocated exclusively to the gNB-DU(s) 228. More specifically, the gNB-CU 226 hosts the radio resource control (RRC), service data adaptation protocol (SDAP), and packet data convergence protocol (PDCP) protocols of the gNB 222. A gNB-DU 228 is a logical node that hosts the radio link control (RLC), medium access control (MAC), and physical (PHY) layers of the gNB 222. Its operation is controlled by the gNB-CU 226. One gNB-DU 228 can support one or more cells, and one cell is supported by only one gNB-DU 228. Thus, a UE 204 communicates with the gNB-CU 226 via the RRC, SDAP, and PDCP layers and with a gNB-DU 228 via the RLC, MAC, and PHY layers.

Figure 3A:
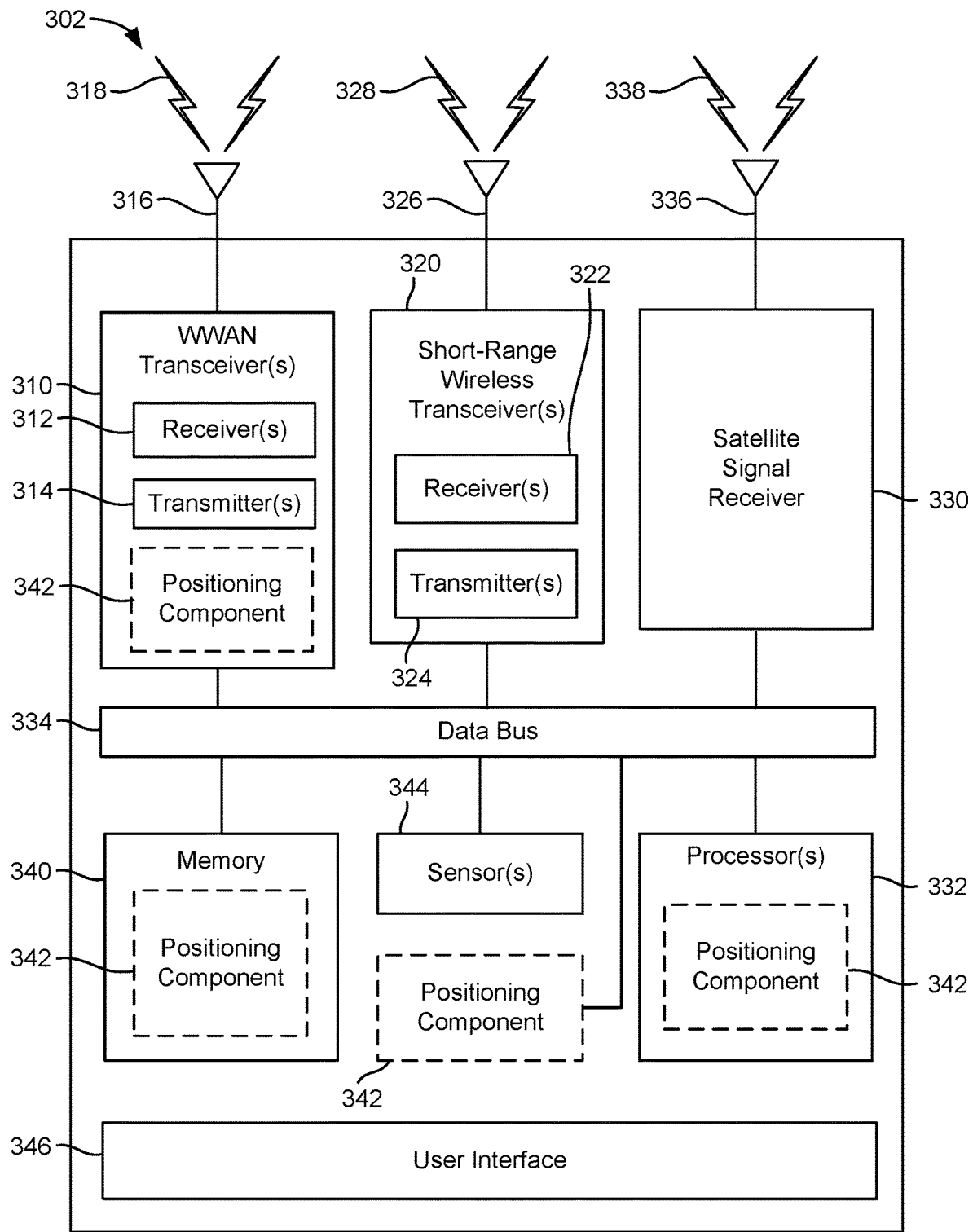
FIGS. 3A, 3B, and 3C are simplified block diagrams of several sample aspects of components that may be employed in a user equipment (UE), a base station, and a network entity, respectively, and configured to support communications as taught herein.
Figure 3B:
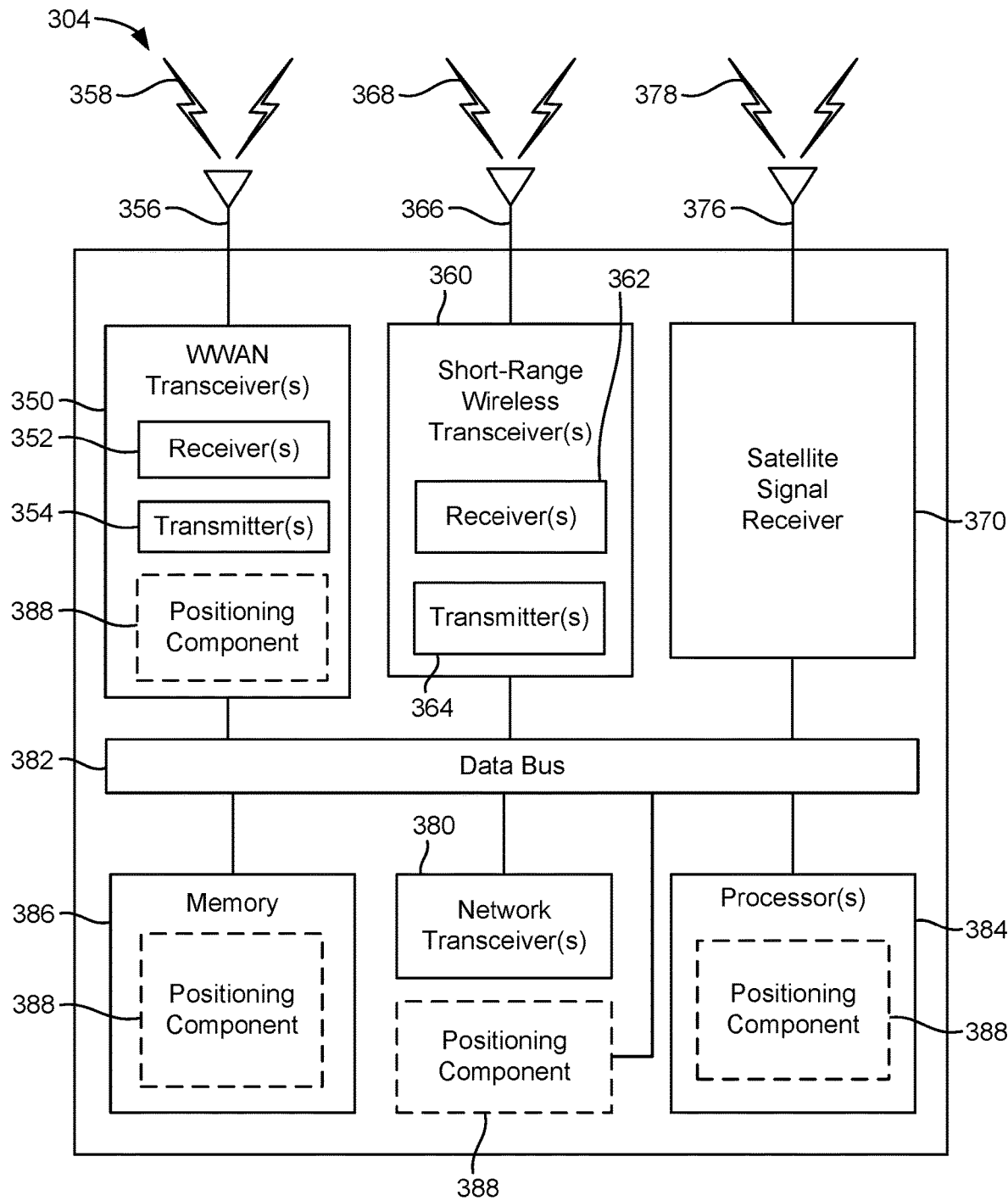
Figure 3C:
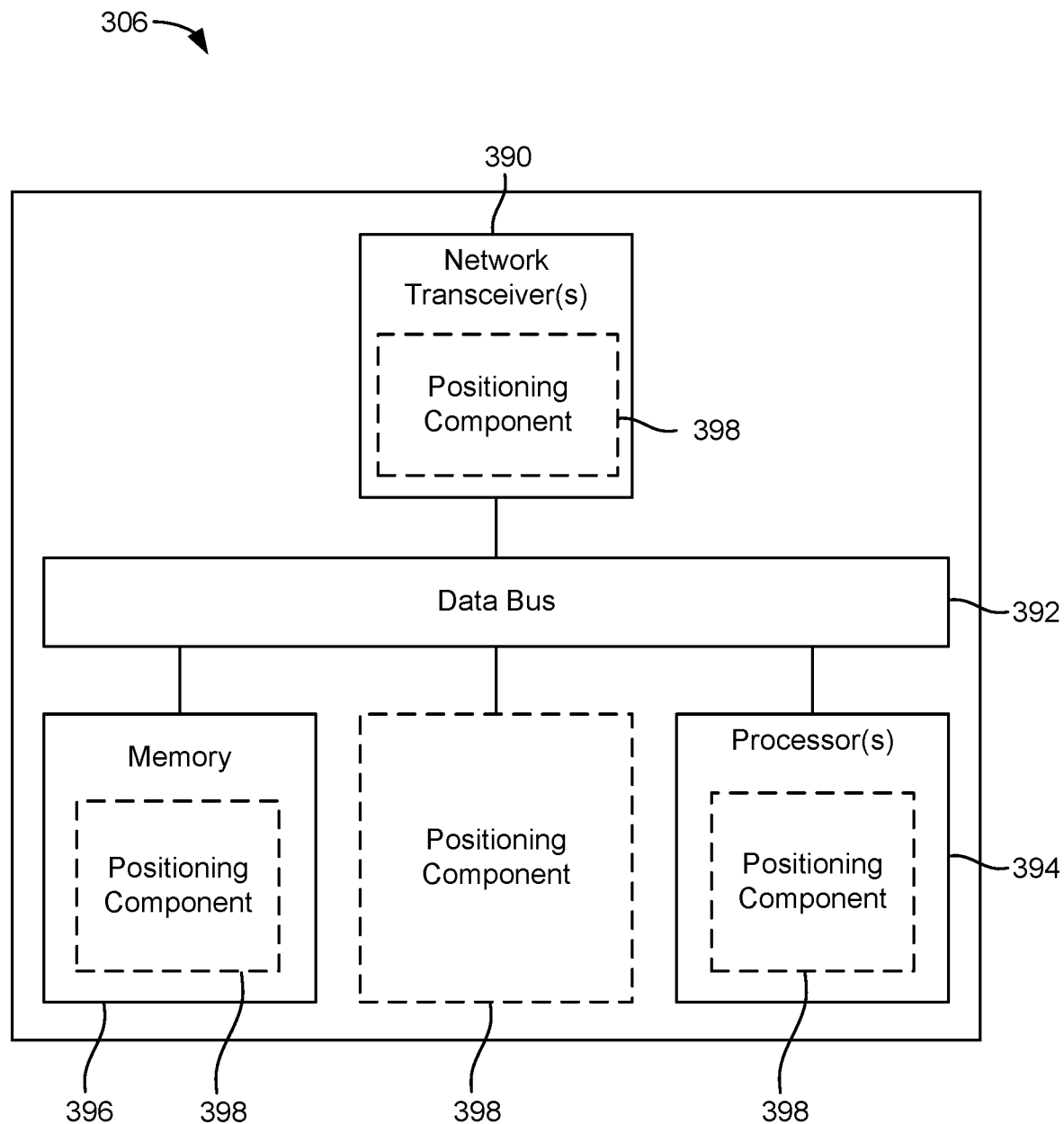

FIGS. 3A, 3B, and 3C illustrate several example components (represented by corresponding blocks) that may be incorporated into a UE 302 (which may correspond to any of the UEs described herein), a base station 304 (which may correspond to any of the base stations described herein), and a network entity 306 (which may correspond to or embody any of the network functions described herein, including the location server 230 and the LMF 270, or alternatively may be independent from the NG-RAN 220 and/or 5GC 210/260 infrastructure depicted in FIGS. 2A and 2B, such as a private network) to support the file transmission operations as taught herein. It will be appreciated that these components may be implemented in different types of apparatuses in different implementations (e.g., in an ASIC, in a system-on-chip (SoC), etc.). The illustrated components may also be incorporated into other apparatuses in a communication system. For example, other apparatuses in a system may include components similar to those described to provide similar functionality. Also, a given apparatus may contain one or more of the components. For example, an apparatus may include multiple transceiver components that enable the apparatus to operate on multiple carriers and/or communicate via different technologies.

The UE 302 and the base station 304 each include one or more wireless wide area network (WWAN) transceivers 310 and 350, respectively, providing means for communicating (e.g., means for transmitting, means for receiving, means for measuring, means for tuning, means for refraining from transmitting, etc.) via one or more wireless communication networks (not shown), such as an NR network, an LTE network, a GSM network, and/or the like. The WWAN transceivers 310 and 350 may each be connected to one or more antennas 316 and 356, respectively, for communicating with other network nodes, such as other UEs, access points, base stations (e.g., eNBs, gNBs), etc., via at least one designated RAT (e.g., NR, LTE, GSM, etc.) over a wireless communication medium of interest (e.g., some set of time/frequency resources in a particular frequency spectrum). The WWAN transceivers 310 and 350 may be variously configured for transmitting and encoding signals 318 and 358 (e.g., messages, indications, information, and so on), respectively, and, conversely, for receiving and decoding signals 318 and 358 (e.g., messages, indications, information, pilots, and so on), respectively, in accordance with the designated RAT. Specifically, the WWAN transceivers 310 and 350 include one or more transmitters 314 and 354, respectively, for transmitting and encoding signals 318 and 358, respectively, and one or more receivers 312 and 352, respectively, for receiving and decoding signals 318 and 358, respectively.

The UE 302 and the base station 304 each also include, at least in some cases, one or more short-range wireless transceivers 320 and 360, respectively. The short-range wireless transceivers 320 and 360 may be connected to one or more antennas 326 and 366, respectively, and provide means for communicating (e.g., means for transmitting, means for receiving, means for measuring, means for tuning, means for refraining from transmitting, etc.) with other network nodes, such as other UEs, access points, base stations, etc., via at least one designated RAT (e.g., WiFi, LTE-D, Bluetooth®, Zigbee®, Z-Wave®, PC5, dedicated short-range communications (DSRC), wireless access for vehicular environments (WAVE), near-field communication (NFC), etc.) over a wireless communication medium of interest. The short-range wireless transceivers 320 and 360 may be variously configured for transmitting and encoding signals 328 and 368 (e.g., messages, indications, information, and so on), respectively, and, conversely, for receiving and decoding signals 328 and 368 (e.g., messages, indications, information, pilots, and so on), respectively, in accordance with the designated RAT. Specifically, the short-range wireless transceivers 320 and 360 include one or more transmitters 324 and 364, respectively, for transmitting and encoding signals 328 and 368, respectively, and one or more receivers 322 and 362, respectively, for receiving and decoding signals 328 and 368, respectively. As specific examples, the short-range wireless transceivers 320 and 360 may be WiFi transceivers, Bluetooth® transceivers, Zigbee® and/or Z-Wave® transceivers, NFC transceivers, or vehicle-to-vehicle (V2V) and/or vehicle-to-everything (V2X) transceivers.

The UE 302 and the base station 304 also include, at least in some cases, satellite signal receivers 330 and 370. The satellite signal receivers 330 and 370 may be connected to one or more antennas 336 and 376, respectively, and may provide means for receiving and/or measuring satellite positioning/communication signals 338 and 378, respectively. Where the satellite signal receivers 330 and 370 are satellite positioning system receivers, the satellite positioning/communication signals 338 and 378 may be global positioning system (GPS) signals, global navigation satellite system (GLONASS) signals, Galileo signals, Beidou signals, Indian Regional Navigation Satellite System (NAVIC), Quasi-Zenith Satellite System (QZSS), etc. Where the satellite signal receivers 330 and 370 are non-terrestrial network (NTN) receivers, the satellite positioning/communication signals 338 and 378 may be communication signals (e.g., carrying control and/or user data) originating from a 5G network. The satellite signal receivers 330 and 370 may comprise any suitable hardware and/or software for receiving and processing satellite positioning/communication signals 338 and 378, respectively. The satellite signal receivers 330 and 370 may request information and operations as appropriate from the other systems, and, at least in some cases, perform calculations to determine locations of the UE 302 and the base station 304, respectively, using measurements obtained by any suitable satellite positioning system algorithm.

The base station 304 and the network entity 306 each include one or more network transceivers 380 and 390, respectively, providing means for communicating (e.g., means for transmitting, means for receiving, etc.) with other network entities (e.g., other base stations 304, other network entities 306). For example, the base station 304 may employ the one or more network transceivers 380 to communicate with other base stations 304 or network entities 306 over one or more wired or wireless backhaul links. As another example, the network entity 306 may employ the one or more network transceivers 390 to communicate with one or more base station 304 over one or more wired or wireless backhaul links, or with other network entities 306 over one or more wired or wireless core network interfaces.

A transceiver may be configured to communicate over a wired or wireless link. A transceiver (whether a wired transceiver or a wireless transceiver) includes transmitter circuitry (e.g., transmitters 314, 324, 354, 364) and receiver circuitry (e.g., receivers 312, 322, 352, 362). A transceiver may be an integrated device (e.g., embodying transmitter circuitry and receiver circuitry in a single device) in some implementations, may comprise separate transmitter circuitry and separate receiver circuitry in some implementations, or may be embodied in other ways in other implementations. The transmitter circuitry and receiver circuitry of a wired transceiver (e.g., network transceivers 380 and 390 in some implementations) may be coupled to one or more wired network interface ports. Wireless transmitter circuitry (e.g., transmitters 314, 324, 354, 364) may include or be coupled to a plurality of antennas (e.g., antennas 316, 326, 356, 366), such as an antenna array, that permits the respective apparatus (e.g., UE 302, base station 304) to perform transmit "beamforming," as described herein. Similarly, wireless receiver circuitry (e.g., receivers 312, 322, 352, 362) may include or be coupled to a plurality of antennas (e.g., antennas 316, 326, 356, 366), such as an antenna array, that permits the respective apparatus (e.g., UE 302, base station 304) to perform receive beamforming, as described herein. In an aspect, the transmitter circuitry and receiver circuitry may share the same plurality of antennas (e.g., antennas 316, 326, 356, 366), such that the respective apparatus can only receive or transmit at a given time, not both at the same time. A wireless transceiver (e.g., WWAN transceivers 310 and 350, short-range wireless transceivers 320 and 360) may also include a network listen module (NLM) or the like for performing various measurements.

As used herein, the various wireless transceivers (e.g., transceivers 310, 320, 350, and 360, and network transceivers 380 and 390 in some implementations) and wired transceivers (e.g., network transceivers 380 and 390 in some implementations) may generally be characterized as "a transceiver," "at least one transceiver," or "one or more transceivers." As such, whether a particular transceiver is a wired or wireless transceiver may be inferred from the type of communication performed. For example, backhaul communication between network devices or servers will generally relate to signaling via a wired transceiver, whereas wireless communication between a UE (e.g., UE 302) and a base station (e.g., base station 304) will generally relate to signaling via a wireless transceiver.

The UE 302, the base station 304, and the network entity 306 also include other components that may be used in conjunction with the operations as disclosed herein. The UE 302, the base station 304, and the network entity 306 include one or more processors 332, 384, and 394, respectively, for providing functionality relating to, for example, wireless communication, and for providing other processing functionality. The processors 332, 384, and 394 may therefore provide means for processing, such as means for determining, means for calculating, means for receiving, means for transmitting, means for indicating, etc. In an aspect, the processors 332, 384, and 394 may include, for example, one or more general purpose processors, multi-core processors, central processing units (CPUs), ASICs, digital signal processors (DSPs), field programmable gate arrays (FPGAs), other programmable logic devices or processing circuitry, or various combinations thereof.

The UE 302, the base station 304, and the network entity 306 include memory circuitry implementing memories 340, 386, and 396 (e.g., each including a memory device), respectively, for maintaining information (e.g., information indicative of reserved resources, thresholds, parameters, and so on). The memories 340, 386, and 396 may therefore provide means for storing, means for retrieving, means for maintaining, etc. In some cases, the UE 302, the base station 304, and the network entity 306 may include positioning component 342, 388, and 398, respectively. The positioning component 342, 388, and 398 may be hardware circuits that are part of or coupled to the processors 332, 384, and 394, respectively, that, when executed, cause the UE 302, the base station 304, and the network entity 306 to perform the functionality described herein. In other aspects, the positioning component 342, 388, and 398 may be external to the processors 332, 384, and 394 (e.g., part of a modem processing system, integrated with another processing system, etc.). Alternatively, the positioning component 342, 388, and 398 may be memory modules stored in the memories 340, 386, and 396, respectively, that, when executed by the processors 332, 384, and 394 (or a modem processing system, another processing system, etc.), cause the UE 302, the base station 304, and the network entity 306 to perform the functionality described herein. FIG. 3A illustrates possible locations of the positioning component 342, which may be, for example, part of the one or more WWAN transceivers 310, the memory 340, the one or more processors 332, or any combination thereof, or may be a standalone component. FIG. 3B illustrates possible locations of the positioning component 388, which may be, for example, part of the one or more WWAN transceivers 350, the memory 386, the one or more processors 384, or any combination thereof, or may be a standalone component. FIG. 3C illustrates possible locations of the positioning component 398, which may be, for example, part of the one or more network transceivers 390, the memory 396, the one or more processors 394, or any combination thereof, or may be a standalone component.

The UE 302 may include one or more sensors 344 coupled to the one or more processors 332 to provide means for sensing or detecting movement and/or orientation information that is independent of motion data derived from signals received by the one or more WWAN transceivers 310, the one or more short-range wireless transceivers 320, and/or the satellite signal receiver 330. By way of example, the sensor(s) 344 may include an accelerometer (e.g., a micro-electrical mechanical systems (MEMS) device), a gyroscope, a geomagnetic sensor (e.g., a compass), an altimeter (e.g., a barometric pressure altimeter), and/or any other type of movement detection sensor. Moreover, the sensor(s) 344 may include a plurality of different types of devices and combine their outputs in order to provide motion information. For example, the sensor(s) 344 may use a combination of a multi-axis accelerometer and orientation sensors to provide the ability to compute positions in two-dimensional (2D) and/or three-dimensional (3D) coordinate systems.

In addition, the UE 302 includes a user interface 346 providing means for providing indications (e.g., audible and/or visual indications) to a user and/or for receiving user input (e.g., upon user actuation of a sensing device such a keypad, a touch screen, a microphone, and so on). Although not shown, the base station 304 and the network entity 306 may also include user interfaces.

Referring to the one or more processors 384 in more detail, in the downlink, IP packets from the network entity 306 may be provided to the processor 384. The one or more processors 384 may implement functionality for an RRC layer, a packet data convergence protocol (PDCP) layer, a radio link control (RLC) layer, and a medium access control (MAC) layer. The one or more processors 384 may provide RRC layer functionality associated with broadcasting of system information (e.g., master information block (MIB), system information blocks (SIBs)), RRC connection control (e.g., RRC connection paging, RRC connection establishment, RRC connection modification, and RRC connection release), inter-RAT mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer PDUs, error correction through automatic repeat request (ARQ), concatenation, segmentation, and reassembly of RLC service data units (SDUs), re-segmentation of RLC data PDUs, and reordering of RLC data PDUs; and MAC layer functionality associated with mapping between logical channels and transport channels, scheduling information reporting, error correction, priority handling, and logical channel prioritization.

The transmitter 354 and the receiver 352 may implement Layer-1 (L1) functionality associated with various signal processing functions. Layer-1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The transmitter 354 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an orthogonal frequency division multiplexing (OFDM) subcarrier, multiplexed with a reference signal (e.g., pilot) in the time and/or frequency domain, and then combined together using an inverse fast Fourier transform (IFFT) to produce a physical channel carrying a time domain OFDM symbol stream. The OFDM symbol stream is spatially precoded to produce multiple spatial streams. Channel estimates from a channel estimator may be used to determine the coding and modulation scheme, as well as for spatial processing. The channel estimate may be derived from a reference signal and/or channel condition feedback transmitted by the UE 302. Each spatial stream may then be provided to one or more different antennas 356. The transmitter 354 may modulate an RF carrier with a respective spatial stream for transmission.

At the UE 302, the receiver 312 receives a signal through its respective antenna(s) 316. The receiver 312 recovers information modulated onto an RF carrier and provides the information to the one or more processors 332. The transmitter 314 and the receiver 312 implement Layer-1 functionality associated with various signal processing functions. The receiver 312 may perform spatial processing on the information to recover any spatial streams destined for the UE 302. If multiple spatial streams are destined for the UE 302, they may be combined by the receiver 312 into a single OFDM symbol stream. The receiver 312 then converts the OFDM symbol stream from the time-domain to the frequency domain using a fast Fourier transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 304. These soft decisions may be based on channel estimates computed by a channel estimator. The soft decisions are then decoded and de-interleaved to recover the data and control signals that were originally transmitted by the base station 304 on the physical channel. The data and control signals are then provided to the one or more processors 332, which implements Layer-3 (L3) and Layer-2 (L2) functionality.

In the uplink, the one or more processors 332 provides demultiplexing between transport and logical channels, packet reassembly, deciphering, header decompression, and control signal processing to recover IP packets from the core network. The one or more processors 332 are also responsible for error detection.

Similar to the functionality described in connection with the downlink transmission by the base station 304, the one or more processors 332 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through hybrid automatic repeat request (HARM), priority handling, and logical channel prioritization.

Channel estimates derived by the channel estimator from a reference signal or feedback transmitted by the base station 304 may be used by the transmitter 314 to select the appropriate coding and modulation schemes, and to facilitate spatial processing. The spatial streams generated by the transmitter 314 may be provided to different antenna(s) 316. The transmitter 314 may modulate an RF carrier with a respective spatial stream for transmission.

The uplink transmission is processed at the base station 304 in a manner similar to that described in connection with the receiver function at the UE 302. The receiver 352 receives a signal through its respective antenna(s) 356. The receiver 352 recovers information modulated onto an RF carrier and provides the information to the one or more processors 384.

In the uplink, the one or more processors 384 provides demultiplexing between transport and logical channels, packet reassembly, deciphering, header decompression, control signal processing to recover IP packets from the UE 302. IP packets from the one or more processors 384 may be provided to the core network. The one or more processors 384 are also responsible for error detection.

For convenience, the UE 302, the base station 304, and/or the network entity 306 are shown in FIGS. 3A, 3B, and 3C as including various components that may be configured according to the various examples described herein. It will be appreciated, however, that the illustrated components may have different functionality in different designs. In particular, various components in FIGS. 3A to 3C are optional in alternative configurations and the various aspects include configurations that may vary due to design choice, costs, use of the device, or other considerations. For example, in case of FIG. 3A, a particular implementation of UE 302 may omit the WWAN transceiver(s) 310 (e.g., a wearable device or tablet computer or PC or laptop may have Wi-Fi and/or Bluetooth capability without cellular capability), or may omit the short-range wireless transceiver(s) 320 (e.g., cellular-only, etc.), or may omit the satellite signal receiver 330, or may omit the sensor(s) 344, and so on. In another example, in case of FIG. 3B, a particular implementation of the base station 304 may omit the WWAN transceiver(s) 350 (e.g., a Wi-Fi "hotspot" access point without cellular capability), or may omit the short-range wireless transceiver(s) 360 (e.g., cellular-only, etc.), or may omit the satellite receiver 370, and so on. For brevity, illustration of the various alternative configurations is not provided herein, but would be readily understandable to one skilled in the art.

The various components of the UE 302, the base station 304, and the network entity 306 may be communicatively coupled to each other over data buses 334, 382, and 392, respectively. In an aspect, the data buses 334, 382, and 392 may form, or be part of, a communication interface of the UE 302, the base station 304, and the network entity 306, respectively. For example, where different logical entities are embodied in the same device (e.g., gNB and location server functionality incorporated into the same base station 304), the data buses 334, 382, and 392 may provide communication between them.

The components of FIGS. 3A, 3B, and 3C may be implemented in various ways. In some implementations, the components of FIGS. 3A, 3B, and 3C may be implemented in one or more circuits such as, for example, one or more processors and/or one or more ASICs (which may include one or more processors). Here, each circuit may use and/or incorporate at least one memory component for storing information or executable code used by the circuit to provide this functionality. For example, some or all of the functionality represented by blocks 310 to 346 may be implemented by processor and memory component(s) of the UE 302 (e.g., by execution of appropriate code and/or by appropriate configuration of processor components). Similarly, some or all of the functionality represented by blocks 350 to 388 may be implemented by processor and memory component(s) of the base station 304 (e.g., by execution of appropriate code and/or by appropriate configuration of processor components). Also, some or all of the functionality represented by blocks 390 to 398 may be implemented by processor and memory component(s) of the network entity 306 (e.g., by execution of appropriate code and/or by appropriate configuration of processor components). For simplicity, various operations, acts, and/or functions are described herein as being performed "by a UE," "by a base station," "by a network entity," etc. However, as will be appreciated, such operations, acts, and/or functions may actually be performed by specific components or combinations of components of the UE 302, base station 304, network entity 306, etc., such as the processors 332, 384, 394, the transceivers 310, 320, 350, and 360, the memories 340, 386, and 396, the positioning component 342, 388, and 398, etc.

In some designs, the network entity 306 may be implemented as a core network component. In other designs, the network entity 306 may be distinct from a network operator or operation of the cellular network infrastructure (e.g., NG RAN 220 and/or 5GC 210/260). For example, the network entity 306 may be a component of a private network that may be configured to communicate with the UE 302 via the base station 304 or independently from the base station 304 (e.g., over a non-cellular communication link, such as WiFi).

Figure 4:
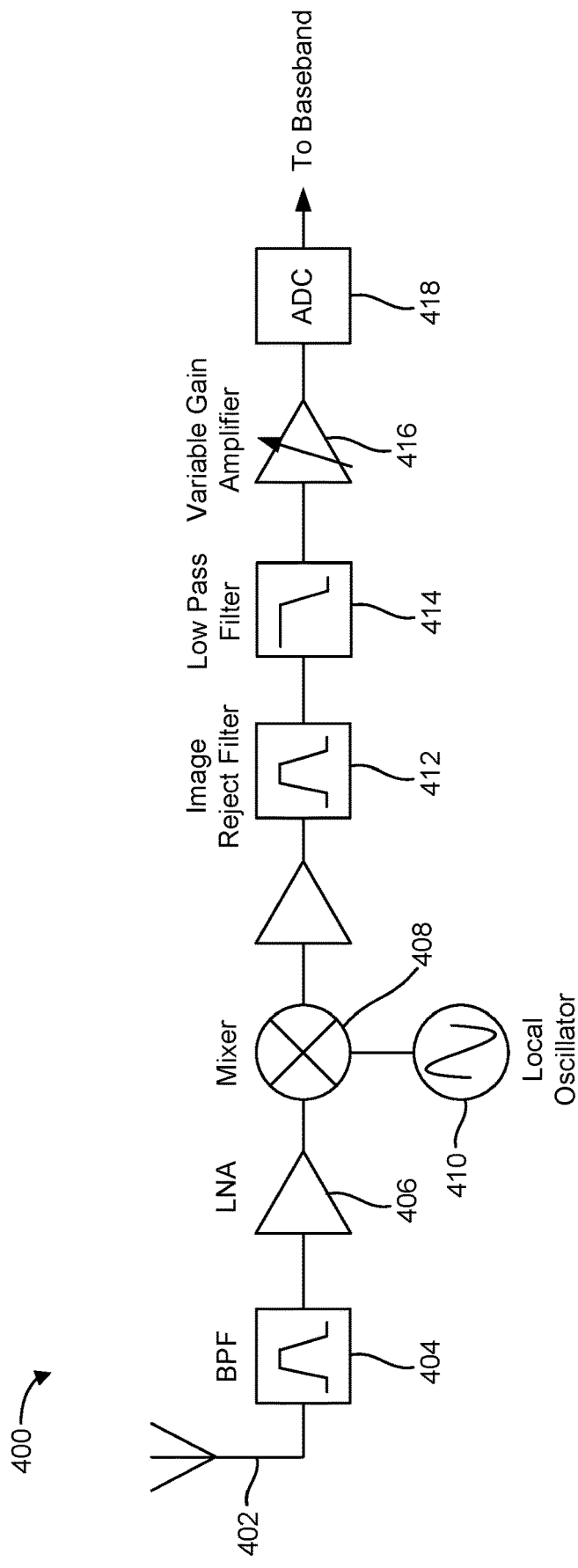
FIG. 4 is a block diagram of an example radio frequency front end receiver architecture, according to aspects of the disclosure.

FIG. 4 illustrates an example low intermediate frequency (IF) radio frequency front end (RFFE) receiver architecture 400, according to aspects of the disclosure. The receiver architecture 400 is an example of the architecture that may be utilized by receiver(s) 312, 322, 352, and/or 362 in FIG. 3. An electromagnetic RF signal is converted to electrical current by an antenna 402. The signal is passed through an RF band-select or band-pass filter (BPF) 404 that covers a wide frequency band to encompass all possible operational frequencies of the applicable standard. The band-pass filter 404 rejects (attenuates) signals reaching the antenna 402 that are outside the operating frequency band. The filtered signal is then amplified by a low noise amplifier (LNA) 406 that increases the power of the signal to a level sufficient to be processed by a mixer 408. The mixer 408 uses a signal generated by a local oscillator 410 to down-convert the received signal to an IF signal. The IF signal is passed to an image-reject filter 412 that only accepts a signal within a predefined frequency band. The signal is then be passed through a low-pass filter 414 to further reject out-of-band signals and mixing products. More specifically, the low-pass filter 414 passes signals with a frequency lower than a selected cutoff frequency and rejects (attenuates) signals with frequencies higher than the cutoff frequency. Thereafter, a variable gain amplifier 416 amplifies the resulting signal, which is then converted to a digital signal by an analog-to-digital converter (ADC) 418. Specifically, the signal from the variable gain amplifier 416 is an analog signal, meaning it is a continuous electromagnetic wave. The ADC 418 samples this continuous wave signal and converts it to a discretized digital signal. The digital signal is provided to baseband circuitry for further processing.

In greater detail, an ADC (e.g., ADC 418) works by sampling the value of the input at discrete intervals in time. Provided that the input is sampled above the Nyquist rate, defined as twice the highest frequency, or bandwidth, of interest, then all frequencies in the signal can be reconstructed. If frequencies above half the Nyquist rate are sampled, they are incorrectly detected as lower frequencies, a process referred to as aliasing. Aliasing occurs because instantaneously sampling a function at two or fewer times per cycle results in missed cycles, and therefore the appearance of an incorrectly lower frequency. For example, a 2 kHz sine wave being sampled at 1.5 kHz would be reconstructed as a 500 Hz sine wave. To avoid aliasing, the input to an ADC is low-pass filtered (e.g., by low-pass filter 414) to remove frequencies above half the sampling rate. A low-pass filter may also be referred to as an anti-aliasing filter, and is needed for an ADC that processes analog signals with higher frequency content. Aliasing and the Nyquist sampling rate are described further below.

The receiver architecture 400 is one example of a channel-select filter, and any other architecture may be substituted. For example, a zero-IF receiver architecture may be utilized, where the RF signal is down-converted to a baseband signal in single or multiple steps.

Figure 5:
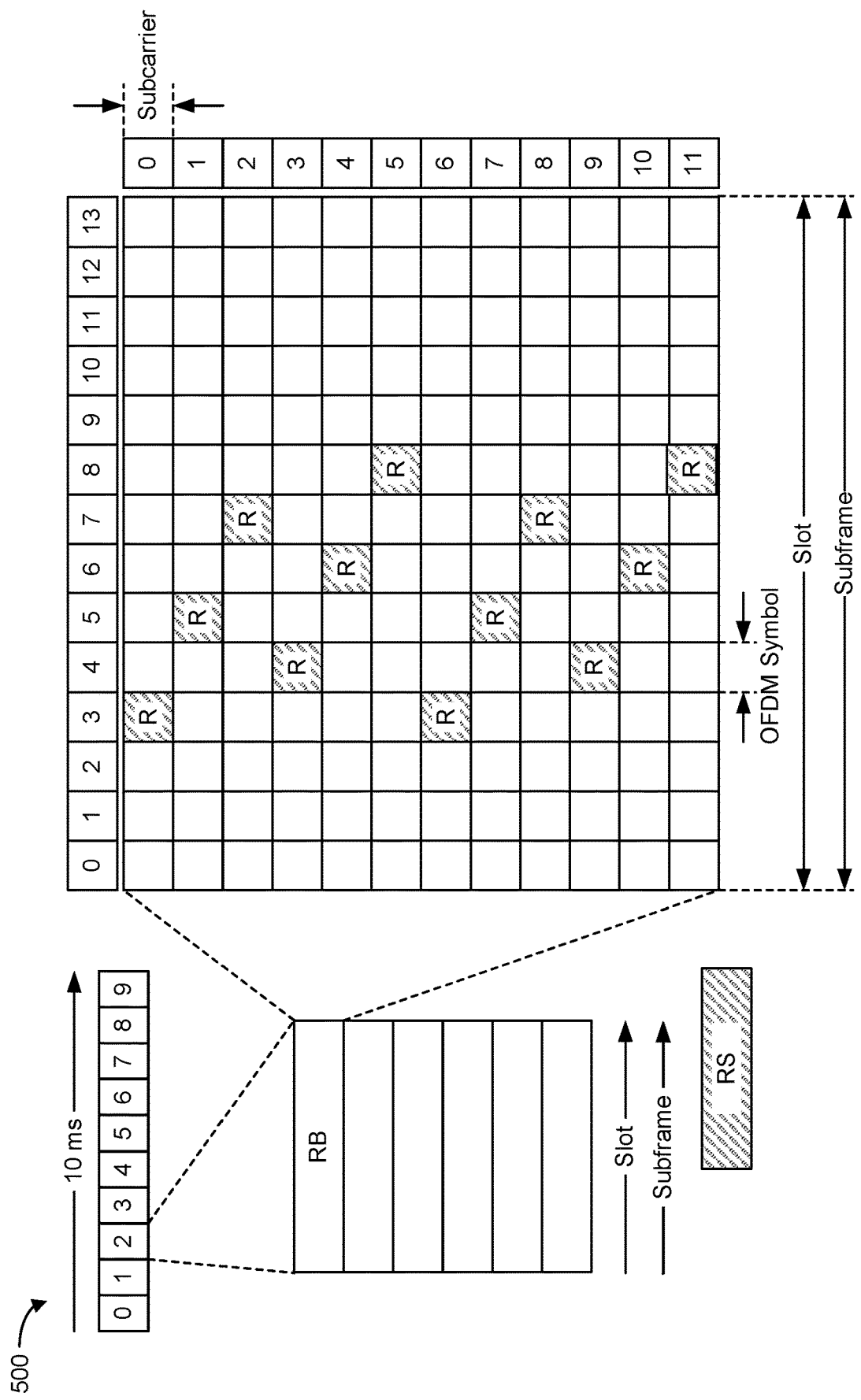
FIG. 5 is a diagram illustrating an example frame structure, according to aspects of the disclosure.

Various frame structures may be used to support downlink and uplink transmissions between network nodes (e.g., base stations and UEs). FIG. 5 is a diagram 500 illustrating an example frame structure, according to aspects of the disclosure. Other wireless communications technologies may have different frame structures and/or different channels.

LTE, and in some cases NR, utilizes OFDM on the downlink and single-carrier frequency division multiplexing (SC-FDM) on the uplink. Unlike LTE, however, NR has an option to use OFDM on the uplink as well. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kilohertz (kHz) and the minimum resource allocation (resource block) may be 12 subcarriers (or 180 kHz). Consequently, the nominal FFT size may be equal to 128, 256, 512, 1024, or 2048 for system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for system bandwidth of 1.25, 2.5, 5, 10, or 20 MHz, respectively.

LTE supports a single numerology (subcarrier spacing (SCS), symbol length, etc.). In contrast, NR may support multiple numerologies ($\mu$), for example, subcarrier spacings of 15 kHz ($\mu=0$), 30 kHz ($\mu=1$), 60 kHz ($\mu=2$), 120 kHz ($\mu=3$), and 240 kHz ($\mu=4$) or greater may be available. In each subcarrier spacing, there are 14 symbols per slot. For 15 kHz SCS ($\mu=0$), there is one slot per subframe, 10 slots per frame, the slot duration is 1 millisecond (ms), the symbol duration is 66.7 microseconds ($\mu$s), and the maximum nominal system bandwidth (in MHz) with a 4K FFT size is 50. For 30 kHz SCS ($\mu=1$), there are two slots per subframe, 20 slots per frame, the slot duration is 0.5 ms, the symbol duration is 33.3 $\mu$s, and the maximum nominal system bandwidth (in MHz) with a 4K FFT size is 100. For 60 kHz SCS ($\mu=2$), there are four slots per subframe, 40 slots per frame, the slot duration is 0.25 ms, the symbol duration is 16.7 $\mu$s, and the maximum nominal system bandwidth (in MHz) with a 4K FFT size is 200. For 120 kHz SCS ($\mu=3$), there are eight slots per subframe, 80 slots per frame, the slot duration is 0.125 ms, the symbol duration is 8.33 $\mu$s, and the maximum nominal system bandwidth (in MHz) with a 4K FFT size is 400. For 240 kHz SCS ($\mu=4$), there are 16 slots per subframe, 160 slots per frame, the slot duration is 0.0625 ms, the symbol duration is 4.17 $\mu$s, and the maximum nominal system bandwidth (in MHz) with a 4K FFT size is 800.

In the example of FIG. 5, a numerology of 15 kHz is used. Thus, in the time domain, a 10 ms frame is divided into 10 equally sized subframes of 1 ms each, and each subframe includes one time slot. In FIG. 5, time is represented horizontally (on the X axis) with time increasing from left to right, while frequency is represented vertically (on the Y axis) with frequency increasing (or decreasing) from bottom to top.

A resource grid may be used to represent time slots, each time slot including one or more time-concurrent resource blocks (RBs) (also referred to as physical RBs (PRBs)) in the frequency domain. The resource grid is further divided into multiple resource elements (REs). An RE may correspond to one symbol length in the time domain and one subcarrier in the frequency domain. In the numerology of FIG. 5, for a normal cyclic prefix, an RB may contain 12 consecutive subcarriers in the frequency domain and seven consecutive symbols in the time domain, for a total of 84 REs. For an extended cyclic prefix, an RB may contain 12 consecutive subcarriers in the frequency domain and six consecutive symbols in the time domain, for a total of 72 REs. The number of bits carried by each RE depends on the modulation scheme.

Some of the REs may carry reference (pilot) signals (RS). The reference signals may include positioning reference signals (PRS), tracking reference signals (TRS), phase tracking reference signals (PTRS), cell-specific reference signals (CRS), channel state information reference signals (CSI-RS), demodulation reference signals (DMRS), primary synchronization signals (PSS), secondary synchronization signals (SSS), synchronization signal blocks (SSBs), sounding reference signals (SRS), etc., depending on whether the illustrated frame structure is used for uplink or downlink communication. FIG. 5 illustrates example locations of REs carrying reference signals (labeled "R").

A collection of resource elements (REs) that are used for transmission of PRS is referred to as a "PRS resource." The collection of resource elements can span multiple PRBs in the frequency domain and 'N' (such as 1 or more) consecutive symbol(s) within a slot in the time domain. In a given OFDM symbol in the time domain, a PRS resource occupies consecutive PRBs in the frequency domain.

The transmission of a PRS resource within a given PRB has a particular comb size (also referred to as the "comb density"). A comb size 'N' represents the subcarrier spacing (or frequency/tone spacing) within each symbol of a PRS resource configuration. Specifically, for a comb size 'N,' PRS are transmitted in every Nth subcarrier of a symbol of a PRB. For example, for comb-4, for each symbol of the PRS resource configuration, REs corresponding to every fourth subcarrier (such as subcarriers 0, 4, 8) are used to transmit PRS of the PRS resource. Currently, comb sizes of comb-2, comb-4, comb-6, and comb-12 are supported for DL-PRS. FIG. 5 illustrates an example PRS resource configuration for comb-6 (which spans six symbols). That is, the locations of the shaded REs (labeled "R") indicate a comb-6 PRS resource configuration.

Currently, a DL-PRS resource may span 2, 4, 6, or 12 consecutive symbols within a slot with a fully frequency-domain staggered pattern. A DL-PRS resource can be configured in any higher layer configured downlink or flexible (FL) symbol of a slot. There may be a constant energy per resource element (EPRE) for all REs of a given DL-PRS resource. The following are the frequency offsets from symbol to symbol for comb sizes 2, 4, 6, and 12 over 2, 4, 6, and 12 symbols. 2-symbol comb-2: {0, 1}; 4-symbol comb-2: {0, 1, 0, 1}; 6-symbol comb-2: {0, 1, 0, 1, 0, 1}; 12-symbol comb-2: {0, 1, 0, 1, 0, 1, 0, 1, 0, 1, 0, 1}; 4-symbol comb-4: {0, 2, 1, 3}; 12-symbol comb-4: {0, 2, 1, 3, 0, 2, 1, 3, 0, 2, 1, 3}; 6-symbol comb-6: {0, 3, 1, 4, 2, 5}; 12-symbol comb-6: {0, 3, 1, 4, 2, 5, 0, 3, 1, 4, 2, 5}; and 12-symbol comb-12: {0, 6, 3, 9, 1, 7, 4, 10, 2, 8, 5, 11}.

A "PRS resource set" is a set of PRS resources used for the transmission of PRS signals, where each PRS resource has a PRS resource ID. In addition, the PRS resources in a PRS resource set are associated with the same TRP. A PRS resource set is identified by a PRS resource set ID and is associated with a particular TRP (identified by a TRP ID). In addition, the PRS resources in a PRS resource set have the same periodicity, a common muting pattern configuration, and the same repetition factor (such as "PRS-ResourceRepetitionFactor") across slots. The periodicity is the time from the first repetition of the first PRS resource of a first PRS instance to the same first repetition of the same first PRS resource of the next PRS instance. The periodicity may have a length selected from $2^\mu*\{4, 5, 8, 10, 16, 20, 32, 40, 64, 80, 160, 320, 640, 1280, 2560, 5120, 10240\}$ slots, with $\mu=0$, 1, 2, 3. The repetition factor may have a length selected from {1, 2, 4, 6, 8, 16, 32} slots.

A PRS resource ID in a PRS resource set is associated with a single beam (or beam ID) transmitted from a single TRP (where a TRP may transmit one or more beams). That is, each PRS resource of a PRS resource set may be transmitted on a different beam, and as such, a "PRS resource," or simply "resource," also can be referred to as a "beam." Note that this does not have any implications on whether the TRPs and the beams on which PRS are transmitted are known to the UE.

A "PRS instance" or "PRS occasion" is one instance of a periodically repeated time window (such as a group of one or more consecutive slots) where PRS are expected to be transmitted. A PRS occasion also may be referred to as a "PRS positioning occasion," a "PRS positioning instance, a "positioning occasion," "a positioning instance," a "positioning repetition," or simply an "occasion," an "instance," or a "repetition."

A "positioning frequency layer" (also referred to simply as a "frequency layer") is a collection of one or more PRS resource sets across one or more TRPs that have the same values for certain parameters. Specifically, the collection of PRS resource sets has the same subcarrier spacing and cyclic prefix (CP) type (meaning all numerologies supported for the physical downlink shared channel (PDSCH) are also supported for PRS), the same Point A, the same value of the downlink PRS bandwidth, the same start PRB (and center frequency), and the same comb-size. The Point A parameter takes the value of the parameter "ARFCN-ValueNR" (where "ARFCN" stands for "absolute radio-frequency channel number") and is an identifier/code that specifies a pair of physical radio channel used for transmission and reception. The downlink PRS bandwidth may have a granularity of four PRBs, with a minimum of 24 PRBs and a maximum of 272 PRBs. Currently, up to four frequency layers have been defined, and up to two PRS resource sets may be configured per TRP per frequency layer.

The concept of a frequency layer is somewhat like the concept of component carriers and bandwidth parts (BWPs), but different in that component carriers and BWPs are used by one base station (or a macro cell base station and a small cell base station) to transmit data channels, while frequency layers are used by several (usually three or more) base stations to transmit PRS. A UE may indicate the number of frequency layers it can support when it sends the network its positioning capabilities, such as during an LTE positioning protocol (LPP) session. For example, a UE may indicate whether it can support one or four positioning frequency layers.

Note that the terms "positioning reference signal" and "PRS" generally refer to specific reference signals that are used for positioning in NR and LTE systems. However, as used herein, the terms "positioning reference signal" and "PRS" may also refer to any type of reference signal that can be used for positioning, such as but not limited to, PRS as defined in LTE and NR, TRS, PTRS, CRS, CSI-RS, DMRS, PSS, SSS, SSB, SRS, UL-PRS, etc. In addition, the terms "positioning reference signal" and "PRS" may refer to downlink or uplink positioning reference signals, unless otherwise indicated by the context. If needed to further distinguish the type of PRS, a downlink positioning reference signal may be referred to as a "DL-PRS," and an uplink positioning reference signal (e.g., an SRS-for-positioning, PTRS) may be referred to as an "UL-PRS." In addition, for signals that may be transmitted in both the uplink and downlink (e.g., DMRS, PTRS), the signals may be prepended with "UL" or "DL" to distinguish the direction. For example, "UL-DMRS" may be differentiated from "DL-DMRS."

Figure 6:
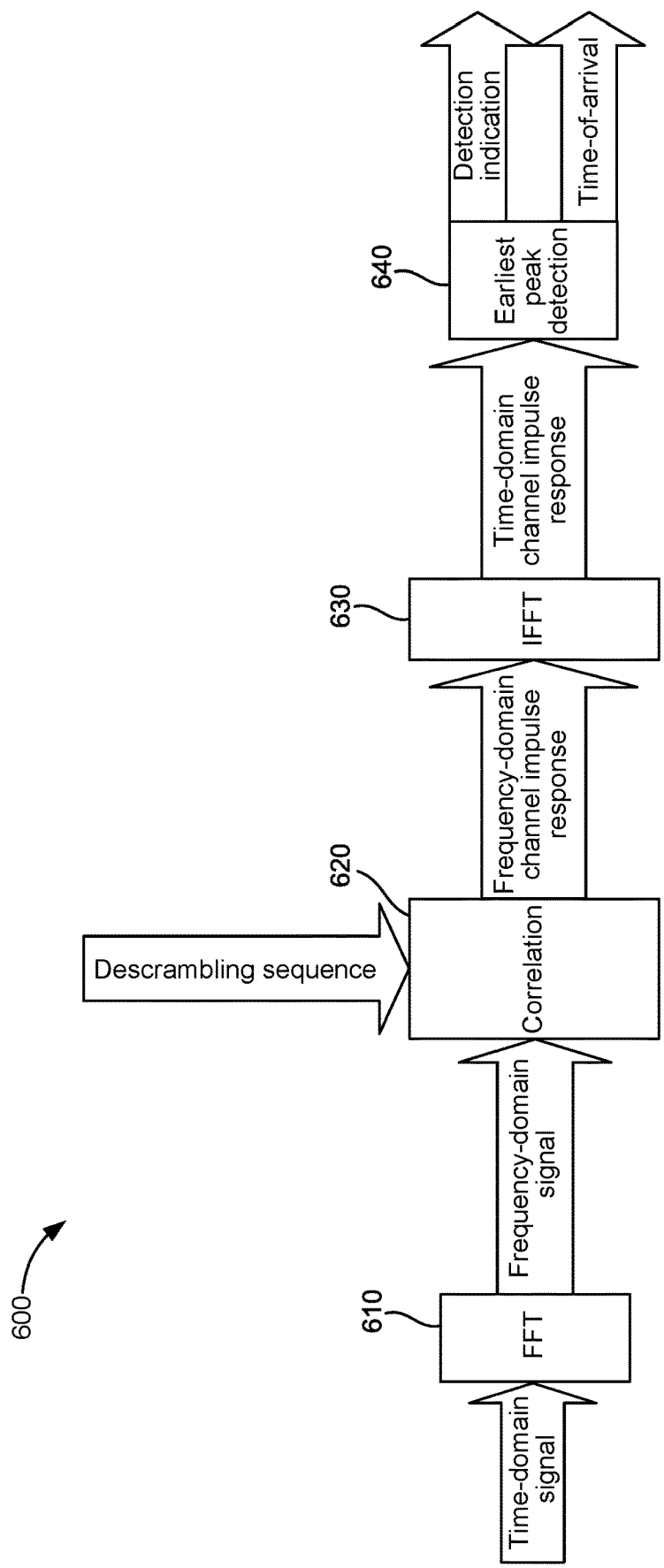
FIG. 6 is a diagram of an example radio frequency (RF) signal processing procedure, according to aspects of the disclosure.

FIG. 6 is a diagram 600 of an example radio frequency (RF) signal processing procedure, according to various aspects of the disclosure. In order to identify the time of arrival (ToA) of an RF signal (e.g., a positioning reference signal (PRS)), the receiver (e.g., a UE) first buffers and then jointly processes all the resource elements (REs) on the channel on which the transmitter (e.g., a base station) is transmitting the RF signal. The receiver then performs an inverse Fourier transform (FFT) to convert the received RF signal to the time domain. The conversion of the received RF signal to the time domain is referred to as the estimation of the channel energy response (CER) or channel impulse response (CIR). The CER shows the peaks on the channel over time, and the earliest "significant" peak should therefore correspond to the ToA of the RF signal. Generally, the receiver will use a noise-related quality threshold to filter out spurious local peaks, thereby presumably correctly identifying significant peaks on the channel. For example, the receiver may choose a ToA estimate that is the earliest local maximum of the CER that is at least 'X' decibels (dB) higher than the median of the CER and a maximum 'Y' dB lower than the main peak on the channel.

Thus, with reference to FIG. 6, at a fast Fourier transform (FFT) stage 610, a receiver (e.g., any of the UEs described herein) receives/measures and buffers a time-domain RF signal (e.g., a PRS) and converts it to a frequency-domain signal. At a correlation stage 620, the receiver generates a frequency-domain channel impulse response from the frequency-domain signal based on a descrambling sequence. At an inverse fast Fourier transform (IFFT) stage 630, the receiver generates a time-domain channel impulse response from the frequency-domain channel impulse response output by the correlation stage 620. At an earliest peak detection stage 640, the receiver generates a detection indication and a ToA of the time-domain RF signal received at the FFT stage 610 based on the time-domain channel impulse response received from the IFFT stage 630.

Where the receiver is a UE, the UE may receive the time-domain RF signal at one or more of antennas 316. The subsequent stages (i.e., FFT stage 610, correlation stage 620, IFFT stage 630, earliest peak detection stage 640) may be performed by the one or more receivers 312, the one or more WWAN transceivers 310, and/or the one or more processors 332, depending on the hardware implementation of the UE. Similarly, where the receiver is a base station, the base station may receive the time-domain RF signal at one or more of antennas 356. The subsequent stages may be performed by the one or more receivers 352, the one or more WWAN transceivers 350, and/or the one or more processors 384, depending on the hardware implementation of the base station.

The accuracy requirements for positioning a UE (whether indoors or outdoors) are becoming increasingly demanding, requiring increasingly advanced hardware on the UE side. However, for at least some industrial scenarios, there is a challenging trade-off between delivering top performance and the likely lower-tier modem of the UE due to cost and economy of scale considerations.

Figure 7:
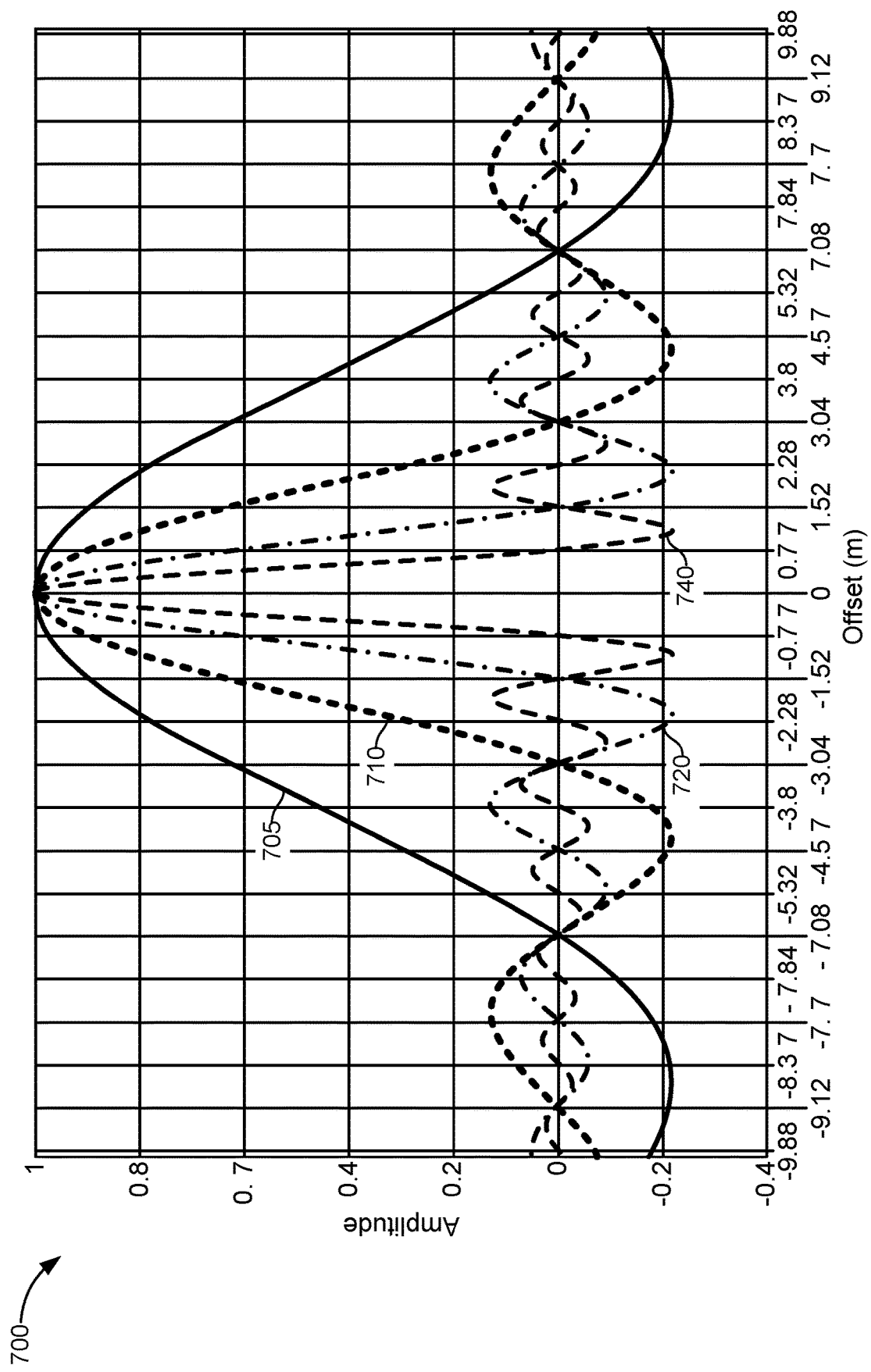
FIG. 7 is a graph showing the relationship between transmission bandwidth and measurement accuracy, according to aspects of the disclosure.

A key resource in delivering positioning accuracy is the signal bandwidth, which allows for higher resolution ranging that translates into higher positioning accuracy. FIG. 7 is a graph 700 showing the relationship between transmission bandwidth and measurement accuracy, according to aspects of the disclosure. The graph 700 includes an x-axis corresponding to an offset (measured, for example, in meters (m)) and a y-axis corresponding to the amplitude of a measurement. The measurement may be a measurement of a correlation between a reference signal (e.g., a PRS) received at a UE and a local mirror of the reference signal as transmitted by the base station (or more specifically, TRP). The peak correlation (e.g., having an amplitude greater than 0.8, 0.9, or some other suitable value) may correspond to a particular amount of offset.

The graph 700 includes measurements associated with different transmission bandwidths, in particular, a 50 MHz measurement 705, a 100 MHz measurement 710, a 200 MHz measurement 720, and a 400 MHz measurement 740. As will be understood from FIG. 7, narrower bands (50 MHz measurement 705 being the narrowest) have peaks that may potentially correspond to a wider range of offsets. For example, if an amplitude of 0.8 or higher is considered a peak, then the peak associated with the 50 MHz measurement 705 is associated with an offset in the range of approximately −2 m to +2 m. By contrast, the peak associated with the 100 MHz measurement 710 may be associated with an offset in the range of approximately −1 m to +1 m. Wider bandwidths (including the 200 MHz measurement 720 and the 400 MHz measurement 740) correspond to increasingly accurate measurements with narrower ranges (−0.5 m to +0.5 m and −0.25 m to +0.25 m, respectively).

The relationship depicted in FIG. 7 indicates that wider bandwidths are associated with more accurate measurements. However, measuring a wider bandwidth requires greater processing capability on the UE's side. Accordingly, the present disclosure provides techniques for preserving the positioning accuracy that comes with using larger (wider) bandwidth signals while leveraging limited modem capabilities. The present techniques also provide a benefit in power reduction for the ADC (e.g., ADC 418 in FIG. 4), as power consumption increases linearly with the sampling rate, and therefore, reducing the sampling rate, as described herein, decreases the power consumption of the ADC.

For any band-limited continuous signal x(t) with single-sided bandwidth (B), the Nyquist sampling theorem states that perfect signal reconstruction is possible from the sequence of samples obtained at frequency $f_s>2B$. This is due to the phenomenon of "aliasing," which causes the spectrum of the sampled signal to be a train of replicas of the continuous signal spectrum spaced by $f_s$.

In greater detail, when a continuous function, x(t), is sampled at a constant rate, $f_s$ samples/second, there is an unlimited number of other continuous functions that fit the same set of samples. However, only one of them is bandlimited to one half of $f_s$ cycles/second (hertz), which means that its Fourier transform, X(f), is '0' for all $|f| \geq \frac{1}{2}f_s$. If the original function, x(t), is bandlimited to $\frac{1}{2} f_s$, it is referred to as the Nyquist criterion. In terms of a function's own bandwidth (B), the Nyquist criterion is often stated as $f_s>2B$, where 2B is referred to as the Nyquist rate for functions with bandwidth B. When the Nyquist criterion is not met (i.e., $B>\frac{1}{2}f_s$), a condition referred to as aliasing occurs, which results in some inevitable differences between x(t) and a reconstructed function that has less bandwidth.

Aliasing is an effect that causes different signals to become indistinguishable (or aliases of one another) when sampled. It also often refers to the distortion or artifact that results when a signal reconstructed from samples is different from the original continuous signal. Aliasing is generally avoided by applying low-pass filters (e.g., low-pass filter 414 in FIG. 4) or anti-aliasing filters (AAF) to the input signal before sampling and when converting a signal from a higher to a lower sampling rate.

With respect to aliasing and the Nyquist sampling theorem, actual signals have a finite duration and their frequency content, as defined by the Fourier transform, has no upper bound. As such, some amount of aliasing always occurs when such functions are sampled. Functions whose frequency content is bounded (bandlimited) have an infinite duration in the time domain. If sampled at a high enough rate, specifically $f_s>2B$, the original function can, in theory, be perfectly reconstructed from the infinite set of samples.

The practical assumption behind the Nyquist sampling theorem is that the frequency spectrum of the original signal is "full." That is, the signal is assumed to occupy the entire available frequency spectrum (e.g., the entire system bandwidth). If the signal is "sparse," meaning only a portion of the available frequency spectrum is used, as in the case of comb sizes greater than comb-1, the aliasing can be controlled to benefit the receiver, as described below.

The present disclosure provides techniques for designing PRS frequency spectrum occupancy to enable a sub-Nyquist sampling receiver to effectively process the PRS. A "sub-Nyquist" sampling receiver is a receiver (e.g., receiver(s) 312) whose ADC operates at a frequency smaller than the Nyquist rate (2B) for the bandwidth of the PRS transmitted. In an aspect, a TRP may transmit PRS over a larger bandwidth (comprising some number of tones) than the operating bandwidth of a UE. The TRP can signal to the UE a mapping between the transmitted physical tones (transmitted in the larger bandwidth) and the received physical tones (i.e., received in the operating bandwidth of the UE). More specifically, the mapping would indicate which tones are occupied and which are not. The UE can use the mapping information to descramble the PRS with the appropriate sequence (as described above with reference to FIG. 6) and reorder the tones for further processing in either time of frequency, thereby leveraging a much larger bandwidth than the UE's normal operating bandwidth.

Figure 8:
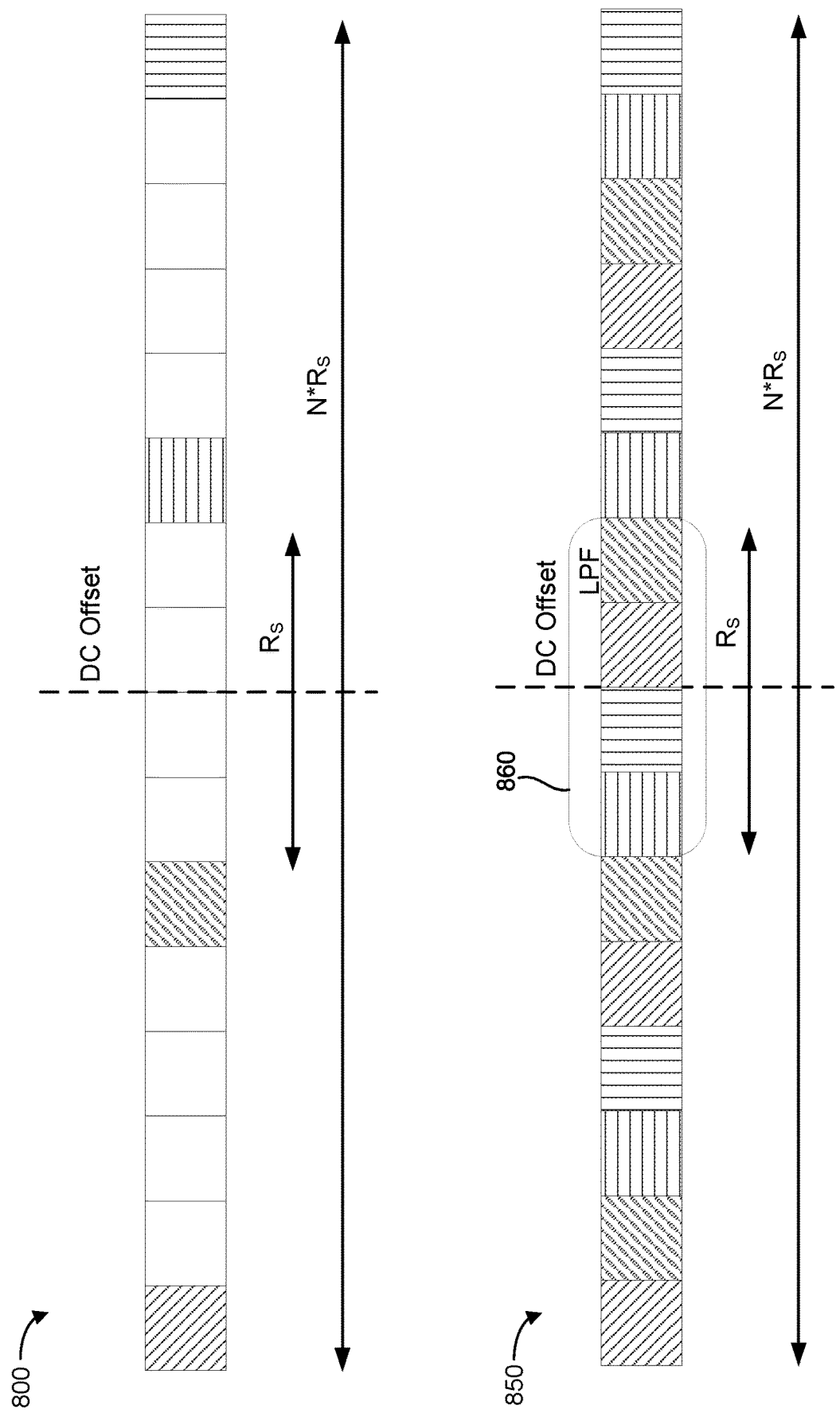
FIG. 8 illustrates a comparison between sampling a wireless signal at the Nyquist rate for that wireless signal and at a sub-Nyquist rate for the wireless signal, according to aspects of the disclosure.

FIG. 8 illustrates a comparison between sampling an RF signal (e.g., a PRS) at the Nyquist rate for that RF signal and at a sub-Nyquist rate for the RF signal, according to aspects of the disclosure. In FIG. 8, each block represents a frequency-domain sample of the RF signal, such as a sample of one or more contiguous tones or PRBs. A direct current (DC) offset (a reference point for the RF signal) is illustrated as a dashed line, and may be a specific tone in the RF signal bandwidth to which the samples of the RF signal can be compared. The parameter Rs is the sampling rate and the parameter N is the folding factor. A folding factor indicates the period (here, a period in the frequency domain) over which samples of an RF signal exhibit symmetrical behavior. In the example of FIG. 8, the RF signal exhibits this symmetry over the folding factor N.

Diagram 800 is a baseband representation of the RF signal if sampled at the Nyquist rate N*Rs, while diagram 850 is a baseband representation of the RF signal if sampled at the sub-Nyquist rate Rs. Because of the higher sampling rate represented by diagram 800, the RF signal is sampled every fifth block (shaded) over the folding factor N, two blocks on either side of the DC offset. Likewise, because of the lower sampling rate represented by diagram 850, the RF signal is sampled in every block. More specifically, by sampling at the higher rate, specifically, N*Rs, the receiver will take samples over the folding factor N that do not include any portion of the RF signal (the blank blocks). In contrast, by sampling at the lower rate, specifically, Rs, the receiver will take N fewer samples, resulting in only the frequency blocks (e.g., tones, PRBs) containing the RF signal being sampled. However, it will also result in aliasing. Specifically, only the four blocks in box 860 around the DC offset correspond to the actual RF signal and will be passed by the low-pass filter (abbreviated "LPF" in FIG. 8 and which may correspond to low-pass filter 414 in FIG. 4). The remaining blocks within the period of the folding factor N are aliases of the four blocks in box 860.

As can be seen from FIG. 8, if the UE uses a different DC offset than the intended one (indicated by the dashed line), it will still have access to the full RF signal. However, the UE would need to rotate the mapping accordingly before performing the IFFT (for time-based earliest arrival path (EAP), for example). This means that the base station signaling containing the tone mapping would also need to specify the frequency at which the UE is expected to place the DC offset.

In order for the UE to correctly sample the RF signal at the sub-Nyquist rate Rs, the UE needs to know the parameters N and Rs. In addition, the TRP needs to configure the RF signal such that it can be correctly sampled at the configured sub-Nyquist rate. The parameters N and Rs may be set in the applicable standard or signaled to the UE by the TRP. Alternatively, the UE may be able to derive these parameters from the tone mapping provided by the TRP. For example, if the RF signal is a PRS, then based on the PRS resource configuration received from the TRP, the UE may be able to determine the folding factor N and the sampling rate Rs that will enable the UE to sample the PRS at the sub-Nyquist rate Rs.

The configuration from the TRP may provide various information. As a first option, the configuration may indicate one PRS resource that spans over approximately N*273 PRBs (e.g., N component carriers, where N is the folding factor and each component carrier comprises 273 PRBs; note, however, that not all N component carriers need to be occupied). The configuration may further indicate the absolute starting point in the frequency domain of the N*273 PRBs. The N*273 PRBs may be part of one frequency layer with similarly large PRS resources across TRPs.

As a second option, the configuration may indicate N PRS resources, where N is the folding factor and each PRS resource is defined on a different frequency layer. In this case, an additional configuration would need to be provided to enable the UE to perform the association between the N PRS resources and the frequency layers. This option may be preferable to the first option where it is preferable to not define a large PRS resource (e.g., N*273 PRBs). In addition, it allows lower-capability UEs to process one layer by centering their operating frequency around that one layer, without having to perform folding.

Figure 9:
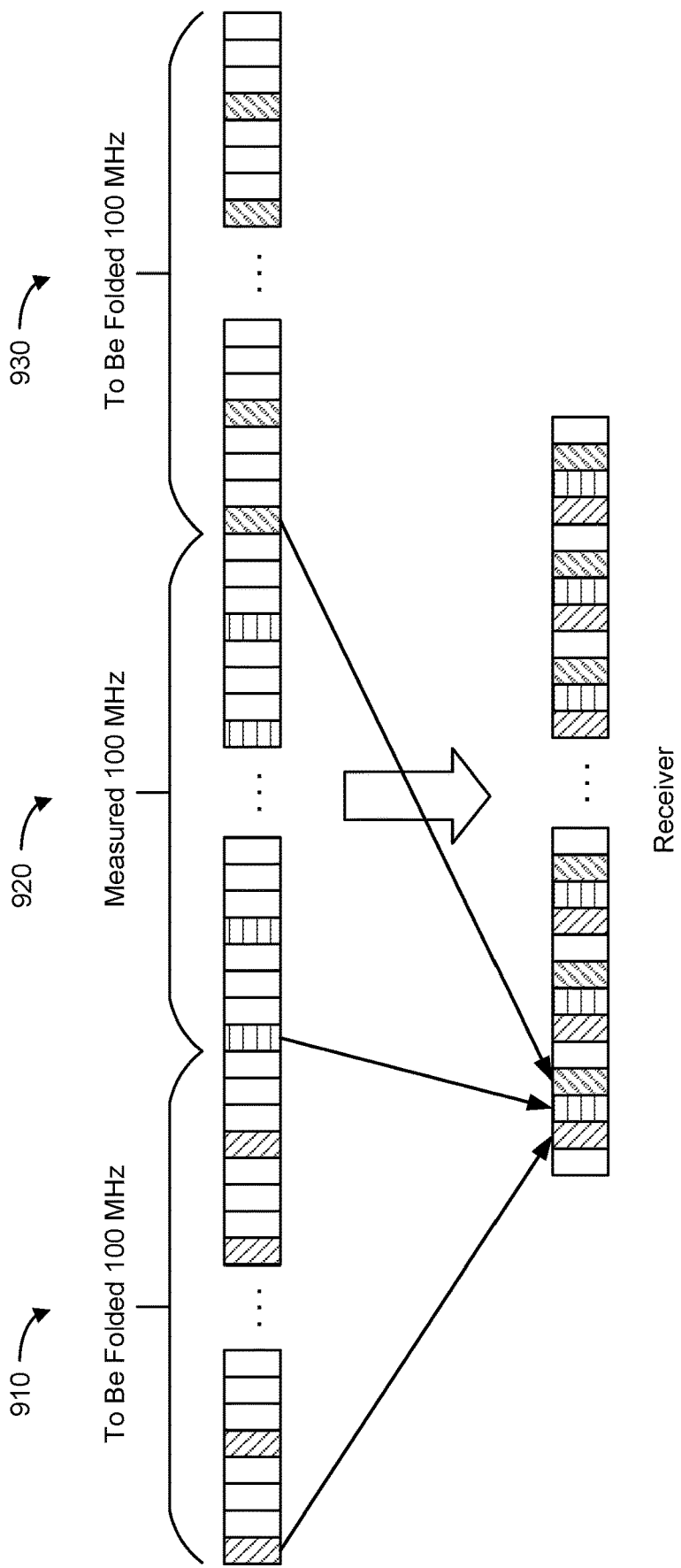
FIG. 9 illustrates an example of folding staggered sets of subcarriers, according to aspects of the disclosure.

The example of FIG. 8 is for a design that defines different blocks of contiguous PRBs, for example. In other aspects, however, blocks of non-contiguous PRBs may be folded together, or even staggered sets of subcarriers may be folded together, as illustrated in FIG. 9. In the example of FIG. 9, three sets of non-contiguous subcarriers, each spanning 100 MHz, are folded together. Specifically, a first set of subcarriers 910 and a third set of subcarriers 930 are folded with a second set of subcarriers 920. The arrows in FIG. 9 indicate how the subcarriers are sampled by the receiver at the sub-Nyquist rate. The scenario illustrated in FIG. 9 would guarantee a better time resolution, as it uniformly spaces out the carriers. A benefit of having the resource blocks staggered to reduce the number of contiguous empty spots is that legacy UEs can still use one of the portions of the allocated PRS and perform traditional PRS processing without leveraging sub-Nyquist sampling.

Within this design, the UE's band-pass filter (e.g., band-pass filter 404 in FIG. 4), before conversion to the IF, would need to cover the TRP-occupied bandwidth rather than the effective low-pass filter bandwidth of the UE. Conversion to the IF (e.g., by mixer 408 in FIG. 8) and image-rejection filtering (e.g., by image-reject filter 412) also need to cover the whole bandwidth (i.e., the bandwidth occupied by the TRP). After the sampling described above (which is performed by the ADC of the UE), the difference between the bandwidth used by the TRP and the bandwidth used by the UE would be completely transparent to the remaining receiver circuitry of the UE.

It should also be noted that for a folding factor N, the signal-to-noise ratio (SNR) would also degrade by 10 log 10(N) due to noise folding compared to reception at the full bandwidth (using Nyquist sampling). In addition, appropriate guard tones would need to be designed per each "portion" (e.g., four-block groups in FIG. 8) to account for potential inter-carrier interference.

Figure 10:
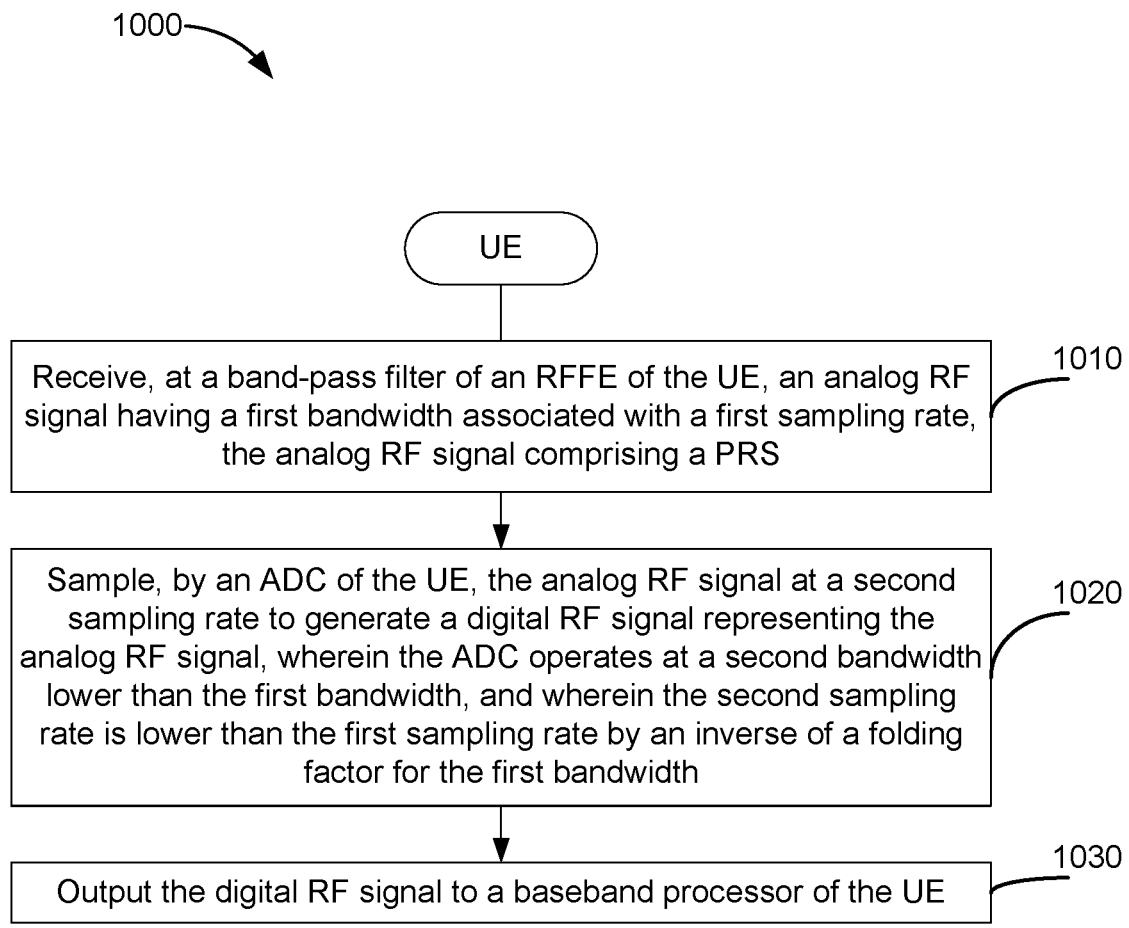
FIG. 10 illustrates an example method of wireless communication, according to aspects of the disclosure.

FIG. 10 illustrates an example method 1000 of wireless communication, according to aspects of the disclosure. In an aspect, method 1000 may be performed by a UE (e.g., any of the UE described herein).

At 1010, a band-pass filter (e.g., band-pass filter 404 in FIG. 4) of a UE (e.g., any of the UEs described herein) receives an analog RF signal (e.g., a PRS) having a first bandwidth (e.g., the operational bandwidth of the TRP transmitting the analog RF signal) associated with a first sampling rate (e.g., the Nyquist rate for the first bandwidth). In an aspect, the band-pass filter 404 may be considered means for performing this operation.

At 1020, an ADC (e.g., ADC 418 in FIG. 4) of the UE samples the analog RF signal at a second sampling rate (e.g., a sub-Nyquist rate) to generate a digital RF signal representing the analog RF signal. The ADC may operate at a second bandwidth lower than the first bandwidth. The second sampling rate may be lower than the first sampling rate by an inverse of a folding factor (e.g., N) for the first bandwidth. In an aspect, the ADC 418 may be considered means for performing this operation.

At 1030, the ADC outputs the digital RF signal to a baseband processor of the UE. In an aspect, the ADC 418 may be considered means for performing this operation. The digital RF signal may be further processed for positioning purposes, for example.

As will be appreciated, technical advantages of the method 1000 include preserving the resolution power that comes with a large bandwidth signal while leveraging limited modem capabilities and reducing the power consumption for the ADC, which increases linearly with the sampling rate.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. A method of wireless communication performed by a user equipment (UE) comprising: receiving, at a band-pass filter of a radio frequency front end (RFFE) of the UE, an analog radio frequency (RF) signal having a first bandwidth associated with a first sampling rate, the analog RF signal comprising a positioning reference signal (PRS); sampling, by an analog-to-digital converter (ADC) of the UE, the analog RF signal at a second sampling rate to generate a digital RF signal representing the analog RF signal, wherein the ADC operates at a second bandwidth lower than the first bandwidth, and wherein the second sampling rate is lower than the first sampling rate by an inverse of a folding factor for the first bandwidth; and outputting the digital RF signal to a baseband processor of the UE.

Clause 2. The method of clause 1, wherein: the first sampling rate is a Nyquist sampling rate for the first bandwidth, and the second sampling rate is a sub-Nyquist sampling rate for the first bandwidth.

Clause 3. The method of any of clauses 1 to 2, wherein: the first sampling rate is $1/N \cdot R_s$, and the second sampling rate is $1/R_s$, where N is the folding factor for the first bandwidth and Rs is a sampling rate.

Clause 4. The method of any of clauses 1 to 3, further comprising: receiving a mapping between frequency tones on which the analog RF signal was transmitted at the first bandwidth and frequency tones on which the analog RF signal is received at the second bandwidth.

Clause 5. The method of clause 4, wherein the sampling the analog RF signal is based on the mapping.

Clause 6. The method of clause 5, wherein the sampling being based on the mapping comprises the UE determining the folding factor for the first bandwidth based on the mapping.

Clause 7. The method of any of clauses 1 to 6, wherein samples of the analog RF signal are centered around a direct current (DC) offset.

Clause 8. The method of clause 7, further comprising: receiving, from a transmission-reception point (TRP) transmitting the analog RF signal, an indication of a reference tone at which the DC offset is to be located.

Clause 9. The method of any of clauses 1 to 8, wherein: the analog RF signal comprises one PRS resource that spans N component carriers, N is a folding factor of the first bandwidth, and the one PRS resource is part of one positioning frequency layer.

Clause 10. The method of any of clauses 1 to 8, wherein: the analog RF signal comprises N PRS resources, N is a folding factor of the first bandwidth, and each of the N PRS resources is defined on a different positioning frequency layer.

Clause 11. The method of any of clauses 1 to 10, further comprising: folding a plurality of blocks of contiguous tones or physical resource blocks (PRBs) carrying the analog RF signal, wherein the sampling comprises sampling the folded plurality of blocks of contiguous tones or PRBs carrying the analog RF signal.

Clause 12. The method of any of clauses 1 to 11, further comprising: folding a plurality of blocks of non-contiguous tones or PRBs carrying the analog RF signal, wherein the sampling comprises sampling the folded plurality of blocks of non-contiguous tones or PRBs carrying the analog RF signal.

Clause 13. The method of any of clauses 1 to 12, further comprising: folding a plurality of sets of staggered subcarriers carrying the analog RF signal, wherein the sampling comprises sampling the folded sets of staggered subcarriers carrying the analog RF signal.

Clause 14. The method of any of clauses 1 to 13, wherein: the first bandwidth comprises an operational bandwidth of a TRP transmitting the analog RF signal, and the second bandwidth comprises an operational bandwidth of the UE.

Clause 15. The method of clause 14, wherein the band-pass filter operates at the operational bandwidth of the TRP.

Clause 16. An apparatus comprising a memory, at least one transceiver, and at least one processor communicatively coupled to the memory and the at least one transceiver, the memory, the at least one transceiver, and the at least one processor configured to perform a method according to any of clauses 1 to 15.

Clause 17. An apparatus comprising means for performing a method according to any of clauses 1 to 15.

Clause 18. A non-transitory computer-readable medium storing computer-executable instructions, the computer-executable comprising at least one instruction for causing a computer or processor to perform a method according to any of clauses 1 to 15.

Additional implementation examples are described in the following numbered clauses:

Clause 1. A method of wireless communication performed by a user equipment (UE) comprising: receiving, at a band-pass filter of a radio frequency front end (RFFE) of the UE, an analog radio frequency (RF) signal having a first bandwidth associated with a first sampling rate, the analog RF signal comprising a positioning reference signal (PRS); sampling, by an analog-to-digital converter (ADC) of the UE, the analog RF signal at a second sampling rate to generate a digital RF signal representing the analog RF signal, wherein the ADC operates at a second bandwidth lower than the first bandwidth, and wherein the second sampling rate is lower than the first sampling rate by an inverse of a folding factor for the first bandwidth; and outputting the digital RF signal to a baseband processor of the UE.

Clause 2. The method of clause 1, wherein: the first sampling rate is a Nyquist sampling rate for the first bandwidth, and the second sampling rate is a sub-Nyquist sampling rate for the first bandwidth.

Clause 3. The method of any of clauses 1 to 2, wherein: the first sampling rate is N*RS, and the second sampling rate is RS, where N is the folding factor for the first bandwidth and RS is a sampling rate.

Clause 4. The method of any of clauses 1 to 3, further comprising: receiving a mapping between frequency tones on which the analog RF signal was transmitted at the first bandwidth and frequency tones on which the analog RF signal is received at the second bandwidth.

Clause 5. The method of clause 4, wherein sampling the analog RF signal is based on the mapping.

Clause 6. The method of clause 5, wherein sampling the analog RF signal being based on the mapping comprises determining the folding factor for the first bandwidth based on the mapping.

Clause 7. The method of any of clauses 4 to 6, wherein samples of the analog RF signal are centered around a direct current (DC) offset.

Clause 8. The method of clause 7, further comprising: receiving, from a transmission-reception point (TRP) transmitting the analog RF signal, an indication of a reference tone at which the DC offset is to be located.

Clause 9. The method of any of clauses 1 to 8, wherein: the analog RF signal comprises one PRS resource that spans N component carriers, N is the folding factor for the first bandwidth, and the one PRS resource is part of one positioning frequency layer.

Clause 10. The method of any of clauses 1 to 8, wherein: the analog RF signal comprises N PRS resources, N is the folding factor for the first bandwidth, and each of the N PRS resources is defined on a different positioning frequency layer.

Clause 11. The method of any of clauses 1 to 10, further comprising: folding a plurality of blocks of contiguous tones or physical resource blocks (PRBs) carrying the analog RF signal, wherein sampling the analog RF signal comprises sampling the folded plurality of blocks of contiguous tones or PRBs carrying the analog RF signal.

Clause 12. The method of any of clauses 1 to 10, further comprising: folding a plurality of blocks of non-contiguous tones or PRBs carrying the analog RF signal, wherein sampling the analog RF signal comprises sampling the folded plurality of blocks of non-contiguous tones or PRBs carrying the analog RF signal.

Clause 13. The method of any of clauses 1 to 10, further comprising: folding a plurality of sets of staggered subcarriers carrying the analog RF signal, wherein sampling the analog RF signal comprises sampling the folded sets of staggered subcarriers carrying the analog RF signal.

Clause 14. The method of any of clauses 1 to 13, wherein: the first bandwidth comprises an operational bandwidth of a TRP transmitting the analog RF signal, and the second bandwidth comprises an operational bandwidth of the UE.

Clause 15. The method of clause 14, wherein the bandpass filter operates at the operational bandwidth of the TRP.

Clause 16. An apparatus comprising a memory, at least one transceiver, and at least one processor communicatively coupled to the memory and the at least one transceiver, the memory, the at least one transceiver, and the at least one processor configured to perform a method according to any of clauses 1 to 15.

Clause 17. An apparatus comprising means for performing a method according to any of clauses 1 to 15.

Clause 18. A non-transitory computer-readable medium storing computer-executable instructions, the computer-executable comprising at least one instruction for causing a computer or processor to perform a method according to any of clauses 1 to 15.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an ASIC, a field-programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A method of wireless communication performed by a user equipment (UE) comprising:
   receiving, at a band-pass filter of a radio frequency front end (RFFE) of the UE, an analog radio frequency (RF) signal having a first bandwidth associated with a first sampling rate, the analog RF signal comprising a positioning reference signal (PRS);
   receiving a mapping between frequency tones on which the analog RF signal was transmitted at the first bandwidth and frequency tones on which the analog RF signal is received at a second bandwidth lower than the first bandwidth;
   sampling, by an analog-to-digital converter (ADC) of the UE, the analog RF signal at a second sampling rate to generate a digital RF signal representing the analog RF signal, wherein the ADC operates at the second bandwidth, and wherein the second sampling rate is lower than the first sampling rate by an inverse of a folding factor for the first bandwidth; and
   outputting the digital RF signal to a baseband processor of the UE.

2. The method of claim 1, wherein:
   the first sampling rate is a Nyquist sampling rate for the first bandwidth, and
   the second sampling rate is a sub-Nyquist sampling rate for the first bandwidth.

3. The method of claim 1, wherein:
   the first sampling rate is N*Rs, and
   the second sampling rate is Rs,
   where N is the folding factor for the first bandwidth and Rs is a sampling rate.

4. The method of claim 1, wherein sampling the analog RF signal is based on the mapping.

5. The method of claim 4, wherein sampling the analog RF signal being based on the mapping comprises determining the folding factor for the first bandwidth based on the mapping.

6. The method of claim 1, wherein samples of the analog RF signal are centered around a direct current (DC) offset.

7. The method of claim 6, further comprising:
   receiving, from a transmission-reception point (TRP) transmitting the analog RF signal, an indication of a reference tone at which the DC offset is to be located.

8. The method of claim 1, wherein:
   the analog RF signal comprises one PRS resource that spans N component carriers,
   N is the folding factor for the first bandwidth, and
   the one PRS resource is part of one positioning frequency layer.

9. The method of claim 1, wherein:
   the analog RF signal comprises NPRS resources,
   N is the folding factor for the first bandwidth, and
   each of the N PRS resources is defined on a different positioning frequency layer.

10. The method of claim 1, further comprising:
    folding a plurality of blocks of contiguous tones or physical resource blocks (PRBs) carrying the analog RF signal,
    wherein sampling the analog RF signal comprises sampling the folded plurality of blocks of contiguous tones or PRBs carrying the analog RF signal.

11. The method of claim 1, further comprising:
    folding a plurality of blocks of non-contiguous tones or physical resource blocks (PRBs) carrying the analog RF signal,
    wherein sampling the analog RF signal comprises sampling the folded plurality of blocks of non-contiguous tones or PRBs carrying the analog RF signal.

12. The method of claim 1, further comprising:
    folding a plurality of sets of staggered subcarriers carrying the analog RF signal,
    wherein sampling the analog RF signal comprises sampling the folded sets of staggered subcarriers carrying the analog RF signal.

13. The method of claim 1, wherein:
    the first bandwidth comprises an operational bandwidth of a transmission-reception point (TRP) transmitting the analog RF signal, and
    the second bandwidth comprises an operational bandwidth of the UE.

14. The method of claim 13, wherein the band-pass filter operates at the operational bandwidth of the TRP.

15. A user equipment (UE), comprising:
    a memory;
    a band-pass filter of a radio frequency front end (RFFE) configured to receive an analog radio frequency (RF) signal having a first bandwidth associated with a first sampling rate, the analog RF signal comprising a positioning reference signal (PRS), wherein a mapping is received between frequency tones on which the analog RF signal was transmitted at the first bandwidth and frequency tones on which the analog RF signal is received at a second bandwidth lower than the first bandwidth;
    an analog-to-digital converter (ADC); and
    a baseband processor communicatively coupled to the ADC, wherein the ADC is configured to:
      sample the analog RF signal at a second sampling rate to generate a digital RF signal representing the analog RF signal, wherein the ADC operates at the second bandwidth, and wherein the second sampling rate is lower than the first sampling rate by an inverse of a folding factor for the first bandwidth; and
      output the digital RF signal to the baseband processor.

16. The UE of claim 15, wherein:
    the first sampling rate is a Nyquist sampling rate for the first bandwidth, and
    the second sampling rate is a sub-Nyquist sampling rate for the first bandwidth.

17. The UE of claim 15, wherein:
    the first sampling rate is N*Rs, and
    the second sampling rate is Rs,
    where N is the folding factor for the first bandwidth and Rs is a sampling rate.

18. The UE of claim 15, wherein the ADC being configured to sample the analog RF signal comprises the ADC being configured to sample the analog RF signal based on the mapping.

19. The UE of claim 18, wherein the ADC being configured to sample the analog RF signal based on the mapping comprises the ADC being configured to determine the folding factor for the first bandwidth based on the mapping.

20. The UE of claim 15, wherein samples of the analog RF signal are centered around a direct current (DC) offset.

21. The UE of claim 15, wherein:
    the analog RF signal comprises one PRS resource that spans N component carriers,
    N is the folding factor for the first bandwidth, and
    the one PRS resource is part of one positioning frequency layer.

22. The UE of claim 15, wherein:
the analog RF signal comprises NPRS resources,
N is the folding factor for the first bandwidth, and
each of the NPRS resources is defined on a different positioning frequency layer.

23. The UE of claim 15, wherein the ADC and a frequency converter are configured to:
fold a plurality of blocks of contiguous tones or physical resource blocks (PRBs) carrying the analog RF signal,
wherein the ADC being configured to sample the analog RF signal comprises the ADC being configured to sample the folded plurality of blocks of contiguous tones or PRBs carrying the analog RF signal.

24. The UE of claim 15, wherein the ADC is further configured to:
fold a plurality of blocks of non-contiguous tones or physical resource blocks (PRBs) carrying the analog RF signal,
wherein the ADC being configured to sample the analog RF signal comprises the ADC being configured to sample the folded plurality of blocks of non-contiguous tones or PRBs carrying the analog RF signal.

25. The UE of claim 15, wherein the ADC is further configured to:
fold a plurality of sets of staggered subcarriers carrying the analog RF signal,
wherein the ADC being configured to sample the analog RF signal comprises the ADC being configured to sample the folded sets of staggered subcarriers carrying the analog RF signal.

26. The UE of claim 15, wherein:
the first bandwidth comprises an operational bandwidth of a transmission-reception point (TRP) transmitting the analog RF signal, and
the second bandwidth comprises an operational bandwidth of the UE.

27. A user equipment (UE), comprising:
means for receiving, at a band-pass filter of a radio frequency front end (RFFE) of the UE, an analog radio frequency (RF) signal having a first bandwidth associated with a first sampling rate, the analog RF signal comprising a positioning reference signal (PRS);
means for receiving a mapping between frequency tones on which the analog RF signal was transmitted at the first bandwidth and frequency tones on which the analog RF signal is received at a second bandwidth lower than the first bandwidth;
means for sampling the analog RF signal at a second sampling rate to generate a digital RF signal representing the analog RF signal, wherein the means for sampling operates at the second bandwidth, and wherein the second sampling rate is lower than the first sampling rate by an inverse of a folding factor for the first bandwidth; and
means for outputting the digital RF signal to a baseband processor of the UE.

28. A non-transitory computer-readable medium storing computer-executable instructions that, when executed by a user equipment (UE), cause the UE to:
receive, at a band-pass filter of a radio frequency front end (RFFE) of the UE, an analog radio frequency (RF) signal having a first bandwidth associated with a first sampling rate, the analog RF signal comprising a positioning reference signal (PRS);
receive a mapping between frequency tones on which the analog RF signal was transmitted at the first bandwidth and frequency tones on which the analog RF signal is received at a second bandwidth lower than the first bandwidth;
sample, by an analog-to-digital converter (ADC), the analog RF signal at a second sampling rate to generate a digital RF signal representing the analog RF signal, wherein the ADC operates at the second bandwidth, and wherein the second sampling rate is lower than the first sampling rate by an inverse of a folding factor for the first bandwidth; and
output the digital RF signal to a baseband processor of the UE.

* * * * *